(12) United States Patent
Gizdarski

(10) Patent No.: US 7,949,921 B2
(45) Date of Patent: May 24, 2011

(54) METHOD AND APPARATUS FOR SYNTHESIS OF AUGMENTED MULTIMODE COMPACTORS

(75) Inventor: Emil Gizdarski, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 269 days.

(21) Appl. No.: 12/235,341

(22) Filed: Sep. 22, 2008

(65) Prior Publication Data

US 2009/0083596 A1    Mar. 26, 2009

Related U.S. Application Data

(60) Provisional application No. 61/048,107, filed on Apr. 25, 2008, provisional application No. 60/974,388, filed on Sep. 21, 2007.

(51) Int. Cl.
G01R 31/28    (2006.01)
(52) U.S. Cl. .................................. 714/729; 714/727
(58) Field of Classification Search .................. 702/185; 714/726, 729, 732, 727
See application file for complete search history.

(56) References Cited

U.S. PATENT DOCUMENTS

| | | | |
|---|---|---|---|
| 3,784,907 A | 1/1974 | Eichelberger | |
| 4,495,629 A | 1/1985 | Zasio et al. | |
| 4,503,537 A | 3/1985 | McAnney | |
| 5,790,562 A | 8/1998 | Murray et al. | |
| 6,557,129 B1 | 4/2003 | Rajski et al. | |
| 6,615,380 B1 | 9/2003 | Kapur et al. | |
| 6,701,505 B1 | 3/2004 | Srinivasan | |
| 6,738,939 B2 | 5/2004 | Udawatta et al. | |
| 6,745,359 B2 | 6/2004 | Nadeau-Dostie et al. | |
| 6,748,564 B1 | 6/2004 | Cullen et al. | |
| 6,782,501 B2 | 8/2004 | Distler et al. | |
| 6,829,740 B2 | 12/2004 | Rajski et al. | |
| 6,874,109 B1 | 3/2005 | Rajski et al. | |
| 6,877,119 B2 | 4/2005 | Lauga et al. | |
| 7,058,869 B2 | 6/2006 | Abdel-Hafez et al. | |
| 7,111,209 B2 | 9/2006 | Rajski et al. | |
| 7,155,648 B2 * | 12/2006 | Jas et al. | 714/726 |
| 7,231,570 B2 | 6/2007 | Wang et al. | |
| 7,370,254 B2 | 5/2008 | Rajski et al. | |
| 7,415,678 B2 | 8/2008 | Gizdarski | |
| 7,500,163 B2 * | 3/2009 | Rajski et al. | 714/729 |

(Continued)

OTHER PUBLICATIONS

Wohl et al. "X-Tolerant Compression and Applicaiton of Scan-ATPG Patterns in a BIST Architecture" IEEE ITC International Test Conference 2003, pp. 727-736.

(Continued)

*Primary Examiner* — David Ton
(74) *Attorney, Agent, or Firm* — Kenta Suzue; Haynes Beffel & Wolfeld LLP

(57) ABSTRACT

Methods and apparatuses for synthesizing and/or implementing an augmented multimode compactor are described. An integrated circuit has circuitry that compacts test response data from scan chains in the integrated circuit under test. In many cases groups of the scan chains are coupled to output registers, such that a same group of scan chains is coupled to sequential elements of different output registers; and the same group is a subset of the scan chains including two or more scan chains. Various computer-implemented methods divide scan chains among at least groups and partitions. The groups disallow sharing a common scan chain from the scan chains, within a particular partition. At least one common scan chain is shared between the groups of different partitions.

19 Claims, 18 Drawing Sheets

U.S. PATENT DOCUMENTS

| | | | |
|---|---|---|---|
| 7,509,550 B2 * | 3/2009 | Rajski et al. | 714/732 |
| 7,729,884 B2 * | 6/2010 | Huang et al. | 702/185 |
| 2002/0093356 A1 | 7/2002 | Williams et al. | |
| 2004/0148554 A1 | 7/2004 | Dervisoglu et al. | |
| 2005/0055617 A1 | 3/2005 | Wang et al. | |
| 2007/0113135 A1 | 5/2007 | Rajski et al. | |

OTHER PUBLICATIONS

Sitchinava et al. "Changing the Scan Enable During Shift" Proceedings of the 22nd IEEE VLSI Test Symposium 2004, consisting of 6 pages.

Wohl et al. "Scalable Selector Architecture for X-Tolerant Deterministic BIST" DAC Jun. 7-11, 2004 San Diego, CA, pp. 934-939.

Mitra et al. "X-Compact: An Efficient Response Compaction Technique", IEEE Transactions on Computer-Aided Design of Integrated Circuits and Systems, vol. 23, No. 3, Mar. 2004, pp. 421-432.

Hakmi et al. "Implementing a Scheme for External Deterministic Self-Test" VLSI Test Symposium, 2005, Proceedings 23rd IEEE, May 1-5, 2005, pp. 101-106.

Reddy et al. "A Data Compression Technique for Built-In Self-Test" IEEE Transactions on Computers, vol. 37, No. 9, Sep. 1988, pp. 1151-1156.

Mitra et al. "X-Compact An Efficient Response Compaction Technique for Test Cost Reduction", ITC International Test Conference, 2002, pp. 311-320.

Chickermane et al. "Channel Masking Synthesis for Efficient On-Chip Test Compression" IEEE ITC International Test Conference 2004, pp. 452-461.

Wohl et al. "Analysis and Design of Optimal Combinational Compactors" Proceedings of the 21st IEEE VLSI Test Symposium, 2003, consisting of 6 pages.

Patel et al. "Application of Saluja-Karpovsky Compactors to Test Responses with Many Unknowns", Proceedings of the 21st IEEE VLSI Test Symposium 2003, consisting of 6 pgs.

Rajski et al. "Convolutional Compaction of Test Responses" IEEE ITC International Test Conference, 2003, pp. 745-754.

Rajski et al. "Synthesis of X-Tolerant Convolutional Compactors" Proceedings of the 23rd IEEE VLSI Test Symposium, 2005, consisting of 6 pages.

Saluja et al. "Testing Computer Hardware Through Data Compression in Space and Time" IEEE International Test Conference 1983, pp. 83-88.

Han et al. "Response Compaction for Test Time and Test Pins Reduction Based on Advanced Convolutional Codes" Proceedings of the 19th IEEE International Symposium on Defect and Fault Tolerance in VLSI Systems 2004, consisting of 8 pages.

R. David "Testing by Feedback Shift Register" IEEE Transactions on Computers, vol. C-29, No. 7, Jul. 1980, pp. 668-673.

Keller—Cadence Design Systems "An Overview of On-Chip Compression Architectures" EDN (Electronics, Design, Strategy, News) Sep. 1, 2006, pp. 61-68.

R.J.G. Smith, "Easily Decodable Efficient Self-Orthogonal Block Codes" IEEE, Electronic Letters Mar. 31, 1977, vol. 13 No. 7, pp. 173-174.

Cheng et al. "Compactor Independent Direct Diagnosis" Proceedings of the 13th Asian Test Symposium (ATS 2004), 6 pages.

Rajski et al. "Modular Compactor of Test Responses" Proceedings of the 24th IEEE VLSI Test Symposium (VTS 2006), 10 pages.

Wohl et al. "Fully X-Tolerant Combinational Scan Compression" International Test Conference IEEE 2007, pp. 1-10.

E. Gizdarski "Constructing Augmented Multimode Compactors" In: 26th IEEE VLSI Test Symposium, Apr. 2008, pp. 29-34.

Rajski Janusz et al. "X-Tolerant Compactor With On-Chip Registration and Sig Nature-Based Diagnosis" IEEE Design & Test of Computers, Sep.-Oct. 2007, vol. 24, Issue 5, pp. 476-485.

International Search Report dated Apr. 1, 2010 from a corresponding PCT Application No. PCT/US2009/055541, consisting of 11 pages.

* cited by examiner

| Scan Chain | (x,y,z) | Blocks & Clusters | | Output Mapping A | Output Mapping B | M₀ | M₁ | | | | | | M₂ | | | | | | | | |
|---|---|---|---|---|---|---|---|---|---|---|---|---|---|---|---|---|---|---|---|---|---|
| | | | | | | | P₀ | | | P₁ | | | $G_{00} \cap G_{1,l}$ | | | $G_{01} \cap G_{1,l}$ | | | $G_{02} \cap G_{1,l}$ | | |
| | | | | | | | $G_{00}$ | $G_{01}$ | $G_{02}$ | $G_{10}$ | $G_{11}$ | $G_{12}$ | | | | | | | | | |
| 0 | (0,0,0) | | $C_0$ | 000 | | A | B | | | | B | | B | | | | | | | | |
| 1 | (1,0,0) | | | 100 | 000 | A | | B | | B | | | | | | | B | | | | |
| 2 | (2,0,0) | | | 200 | | A | | | B | | | B | | | | | | | | | B |
| 3 | (0,1,0) | | $C_1$ | 011 | | A | | B | | B | | | | | | | | | | B | |
| 4 | (1,1,0) | $B_0$ | | 111 | 011 | A | B | | | | B | | | B | | | | | | | |
| 5 | (2,1,0) | | | 211 | | A | | B | B | | | | | | B | | | | | | |
| 6 | (0,2,0) | | $C_2$ | 022 | | A | | B | | | B | | | | | | B | | | | |
| 7 | (1,2,0) | | | 122 | 022 | A | | | B B | | | | | | | | | B | | | |
| 8 | (2,2,0) | | | 222 | | A | B | | | | B | | | | B | | | | | | |
| 9 | (0,0,1) | | $C_3$ | 012 | | A | B | | | B | | | B | | | | | | | | |
| 10 | (1,0,1) | | | 112 | 112 | A | | B | | B | | | | | | | B | | | | |
| 11 | (2,0,1) | | | 212 | | A | | | B | | | B | | | | | | | | | B |
| 12 | (0,1,1) | | $C_4$ | 020 | | A | | B | | B | | | | | | | | | | B | |
| 13 | (1,1,1) | $B_1$ | | 120 | 120 | A | B | | | | B | | | B | | | | | | | |
| 14 | (2,1,1) | | | 220 | | A | | B | B | | | | | | B | | | | | | |
| 15 | (0,2,1) | | $C_5$ | 001 | | A | | B | | | B | | | | | | B | | | | |
| 16 | (1,2,1) | | | 101 | 101 | A | | | B B | | | | | | | | | B | | | |
| 17 | (2,2,1) | | | 201 | | A | B | | | | B | | | | B | | | | | | |
| 18 | (0,0,2) | | $C_6$ | 021 | | A | B | | | B | | | B | | | | | | | | |
| 19 | (1,0,2) | | | 121 | 221 | A | | B | | B | | | | | | | B | | | | |
| 20 | (2,0,2) | | | 221 | | A | | | B | | | B | | | | | | | | | B |
| 21 | (0,1,2) | | $C_7$ | 002 | | A | | B | | B | | | | | | | | | | B | |
| 22 | (1,1,2) | $B_2$ | | 102 | 202 | A | B | | | | B | | | B | | | | | | | |
| 23 | (2,1,2) | | | 202 | | A | | B | B | | | | | | B | | | | | | |
| 24 | (0,2,2) | | $C_8$ | 010 | | A | | B | | | B | | | | | | B | | | | |
| 25 | (1,2,2) | | | 110 | 210 | A | | | B B | | | | | | | | | B | | | |
| 26 | (2,2,2) | | | 210 | | A | B | | | | B | | | | B | | | | | | |

FIG. 2

| | Group of Outputs $O_i$ | | | Partition $P_i$ |
|---|---|---|---|---|
| Scan Chain (x,y,z) | i=0 | i={1,2,..,Q−1} | i={Q,Q+1,..,N−1} | i={0,1,..,T−1} |
| Output Mapping A | x | (x+iy) mod N | (y+iz) mod N | |
| Output Mapping B | z | (y+iz) mod N | (y+iz) mod N | (x+(N−i−1)y) mod N |

| Scan Chain (x,y,z) | Blocks | Clusters | Output Mapping A | $M_0$ | $M_1$ $P_0$ $G_{00}$ | $G_{01}$ | $G_{02}$ | $M_1$ $P_1$ $G_{10}$ | $G_{11}$ | $G_{12}$ | $M_2$ $G_{00} \cap G_{1,l}$ | | | $G_{01} \cap G_{1,l}$ | | | $G_{02} \cap G_{1,l}$ | | |
|---|---|---|---|---|---|---|---|---|---|---|---|---|---|---|---|---|---|---|---|
| 0 (0,0,0) | $B_0$ | $C_0$ | 000 | A | A | | | A | | | A | | | | | | | | |
| 1 (1,0,0) | | $C_0$ | 100 | A | | A | | A | | | | | | | A | | | | |
| 2 (2,0,0) | | $C_0$ | 200 | A | | | A | | A | | | | | | | | | | A |
| 3 (0,1,0) | | $C_1$ | 011 | A | | | A | A | | | | | | | | | | | A | |
| 4 (1,1,0) | | $C_1$ | 111 | A | A | | | | A | | | A | | | | | | | | |
| 5 (2,1,0) | | $C_1$ | 211 | A | | A | | A | | | | | | | A | | | | | |
| 6 (0,2,0) | | $C_2$ | 022 | A | | A | | | A | | | | | | | | A | | | |
| 7 (1,2,0) | | $C_2$ | 122 | A | | | A | A | | | | | | | | | | A | | |
| 8 (2,2,0) | | $C_2$ | 222 | A | A | | | | A | | | | A | | | | | | | |
| 9 (0,0,1) | $B_1$ | $C_3$ | 012 | A | A | | | A | | | A | | | | | | | | |
| 10 (1,0,1) | | $C_3$ | 112 | A | | A | | A | | | | | | | A | | | | |
| 11 (2,0,1) | | $C_3$ | 212 | A | | | A | | A | | | | | | | | | | A |
| 12 (0,1,1) | | $C_4$ | 020 | A | | | A | A | | | | | | | | | | | A | |
| 13 (1,1,1) | | $C_4$ | 120 | A | A | | | | A | | | A | | | | | | | | |
| 14 (2,1,1) | | $C_4$ | 220 | A | | A | | A | | | | | | | A | | | | | |
| 15 (0,2,1) | | $C_5$ | 001 | A | | A | | | A | | | | | | | | A | | | |
| 16 (1,2,1) | | $C_5$ | 101 | A | | | A | A | | | | | | | | | | A | | |
| 17 (2,2,1) | | $C_5$ | 201 | A | A | | | | A | | | | A | | | | | | | |
| 18 (0,0,2) | $B_2$ | $C_6$ | 021 | A | A | | | A | | | A | | | | | | | | |
| 19 (1,0,2) | | $C_6$ | 121 | A | | A | | A | | | | | | | A | | | | |
| 20 (2,0,2) | | $C_6$ | 221 | A | | | A | | A | | | | | | | | | | A |
| 21 (0,1,2) | | $C_7$ | 002 | A | | | A | A | | | | | | | | | | | A | |
| 22 (1,1,2) | | $C_7$ | 102 | A | A | | | | A | | | A | | | | | | | | |
| 23 (2,1,2) | | $C_7$ | 202 | A | | A | | A | | | | | | | A | | | | | |
| 24 (0,2,2) | | $C_8$ | 010 | A | | A | | | A | | | | | | | | A | | | |
| 25 (1,2,2) | | $C_8$ | 110 | A | | | A | A | | | | | | | | | | A | | |
| 26 (2,2,2) | | $C_8$ | 210 | A | A | | | | A | | | | A | | | | | | | |

| Mode | Code | $G_{00}\ G_{01}\ G_{02}$ | $G_{10}\ G_{11}\ G_{12}$ | $G_{20}\ G_{21}\ G_{22}$ | Selector function |
|---|---|---|---|---|---|
| $M_0$ | 0 | 1 1 1 | 1 1 1 | 1 1 1 | 1 |
| $M_{11}$ | 10 | 1 1 0 | 1 1 1 | 1 1 1 | $G_{00} \cup G_{01}$ |
| $M_{11}$ | 10 | 1 1 1 | 1 0 1 | 1 1 1 | $G_{10} \cup G_{12}$ |
| $M_{11}$ | 10 | 1 1 1 | 1 1 1 | 0 1 1 | $G_{21} \cup G_{22}$ |
| ... | ... | ... | ... | ... | ... |
| $M_1$ | 10 | 1 0 0 | 1 1 1 | 1 1 1 | $G_{00}$ |
| $M_1$ | 10 | 0 1 0 | 1 1 1 | 1 1 1 | $G_{01}$ |
| $M_1$ | 10 | 0 0 1 | 1 1 1 | 1 1 1 | $G_{02}$ |
| $M_1$ | 10 | 1 1 1 | 1 0 0 | 1 1 1 | $G_{10}$ |
| $M_1$ | 10 | 1 1 1 | 0 1 0 | 1 1 1 | $G_{11}$ |
| $M_1$ | 10 | 1 1 1 | 0 0 1 | 1 1 1 | $G_{12}$ |
| $M_1$ | 10 | 1 1 1 | 1 1 1 | 1 0 0 | $G_{20}$ |
| $M_1$ | 10 | 1 1 1 | 1 1 1 | 0 1 0 | $G_{21}$ |
| $M_1$ | 10 | 1 1 1 | 1 1 1 | 0 0 1 | $G_{22}$ |
| ... | ... | ... | ... | ... | ... |
| $M_{21}$ | 110 | 1 1 0 | 1 1 1 | 1 0 1 | $(G_{00} \cup G_{01}) \cap (G_{20} \cap G_{22})$ |
| ... | ... | ... | ... | ... | ... |
| $M_{22}$ | 111 | 1 0 0 | 1 0 0 | $s_0\ s_1\ s_2$ | $\bigcup_{i=0,..,2}(G_{00} \cap G_{10} \cap s_i \cap G_{2i})$ |
| $M_{22}$ | 111 | 0 1 0 | 1 0 0 | $s_0\ s_1\ s_2$ | $\bigcup_{i=0,..,2}(G_{01} \cap G_{10} \cap s_i \cap G_{2i})$ |
| $M_{22}$ | 111 | 0 0 1 | 1 0 0 | $s_0\ s_1\ s_2$ | $\bigcup_{i=0,..,2}(G_{02} \cap G_{10} \cap s_i \cap G_{2i})$ |
| ... | ... | ... | ... | ... | ... |
| $M_2$ | 110 | 0 0 1 | 0 0 1 | 0 0 1 | $G_{02} \cap G_{12} \cap G_{22}$ |
| ... | ... | ... | ... | ... | ... |

FIG. 13

| Mode | Indirect selection | Direct selection |
|------|-------------------|------------------|

FIG. 14

| N | L1 | L2 | S | #chains | #FFs | ratio | Prob. for quadruple error masking | | |
|---|---|---|---|---|---|---|---|---|---|
| | | | | | | | M0 | M1 | M2 |
| 3 | 4 | 5 | 60 | 27 | 21 | 1.29 | 2.134E-05 | 3.537E-06 | 3.867E-07 |
| 4 | 5 | 7 | 140 | 64 | 28 | 2.29 | 9.890E-07 | 1.075E-07 | 1.183E-08 |
| 5 | 6 | 7 | 210 | 125 | 33 | 3.76 | 2.055E-07 | 1.828E-08 | 1.107E-09 |
| 6 | 7 | 11 | 462 | 216 | 42 | 5.14 | 1.615E-08 | 9.597E-1 | 5.791E-11 |
| 7 | 8 | 9 | 504 | 343 | 45 | 7.62 | 9.477E-09 | 5.108E-10 | 1.778E-11 |
| 8 | 9 | 11 | 792 | 512 | 52 | 9.85 | 1.193E-09 | 5.082E-11 | 2.270E-12 |
| 9 | 10 | 11 | 990 | 729 | 57 | 12.79 | 5.582E-10 | 2.482E-11 | 7.224E-13 |
| 10 | 11 | 13 | 1430 | 1000 | 64 | 15.63 | 1.372E-10 | 4.302E-12 | 1.800E-13 |
| 11 | 12 | 13 | 1716 | 1331 | 69 | 19.29 | 7.221E-11 | 2.501E-12 | 6.118E-14 |
| 12 | 13 | 17 | 2652 | 1728 | 78 | 22.15 | 2.353E-11 | 5.821E-13 | 1.682E-14 |
| 13 | 14 | 15 | 2730 | 2197 | 81 | 27.12 | 1.453E-11 | 4.048E-13 | 7.726E-15 |

FIG. 20

| N | L1 | L2 | S | #chains | #FFs | ratio | Prob. for quadruple error masking | | |
|---|---|---|---|---|---|---|---|---|---|
| | | | | | | | M0 | M1 | M2 |
| 3 | 4 | 5 | 60 | 27 | 25 | 1.08 | 4.561E-06 | 7.962E-07 | 1.706E-07 |
| 4 | 5 | 7 | 140 | 64 | 33 | 1.94 | 3.258E-07 | 2.581E-08 | 4.660E-09 |
| 5 | 6 | 7 | 210 | 125 | 37 | 3.38 | 5.122E-08 | 2.927E-09 | 2.706E-10 |
| 6 | 7 | 11 | 462 | 216 | 49 | 4.41 | 4.785E-09 | 1.682E-10 | 5.515E-12 |
| 7 | 8 | 9 | 504 | 343 | 49 | 7.00 | 1.972E-09 | 4.509E-11 | 4.336E-13 |
| 8 | 9 | 11 | 792 | 512 | 57 | 8.98 | 4.784E-10 | 8.470E-12 | 8.732E-14 |
| 9 | 10 | 11 | 990 | 729 | 61 | 11.95 | 1.600E-10 | 1.275E-12 | 0 |
| 10 | 11 | 13 | 1430 | 1000 | 69 | 14.49 | 6.223E-11 | 5.400E-13 | 0 |
| 11 | 12 | 13 | 1716 | 1331 | 73 | 18.23 | 2.583E-11 | 9.942E-14 | 0 |
| 12 | 13 | 17 | 2652 | 1728 | 85 | 20.33 | 9.596E-12 | 6.730E-14 | 0 |
| 13 | 14 | 15 | 2730 | 2197 | 85 | 25.85 | 5.499E-12 | 1.545E-14 | 0 |

FIG. 21

METHOD AND APPARATUS FOR SYNTHESIS OF AUGMENTED MULTIMODE COMPACTORS

REFERENCE TO RELATED APPLICATION

This application claims the benefit U.S. Provisional Application Nos. 60/974,388 filed 21 Sep. 2007 and 61/048,107 filed 25 Apr. 2008, which applications are incorporated herein by reference.

BACKGROUND

1. Field

The technology relates to electronic design automation in the integrated circuit industry. Various embodiments relate to testing and diagnosis of integrated circuits and more particularly to test response compaction used in test data volume and test application time reduction for integrated circuits.

2. Description of Related Art

Electronic design automation EDA is applied in the semiconductor industry for virtually all device design projects. After an idea for the product is developed, EDA tools are utilized to define a specific implementation. The implementation defined using EDA tools is used to create mask data used for production of masks for lithographic use in the production of the finished chips, in a process referred to as tape-out. The masks are then created and used with fabrication equipment to manufacture integrated circuit wafers. Testing is a required step to defective wafer. Next, diagnosis is applied to identify rood cause for systematic defects which are used for masks correction in order to improve yield. Finally, the wafers are diced, packaged and assembled to provide integrated circuit chips for distribution.

An exemplary procedure for design using EDA tools begins with an overall system design using architecture defining tools that describe the functionality of the product to be implemented using the integrated circuit. Next, logic design tools are applied to create a high level description based on description languages such as Verilog or VHDL, and functional verification tools are applied in an iterative process to assure that the high-level description accomplishes the design goals. Next, synthesis and design-for-test tools are used to translate the high-level description to a netlist, optimize the netlist for target technology, and design and implement tests that permit checking of the finished chip against the netlist.

A typical design flow might next include a design planning stage, in which an overall floor plan for the chip is constructed and analyzed to ensure that timing parameters for the netlist can be achieved at a high level. Next, the netlist may be rigorously checked for compliance with timing constraints and with the functional definitions defined at the high level using VHDL or Verilog. After an iterative process to settle on a netlist and map the netlist to a cell library for the final design, a physical implementation tool is used for placement and routing. A tool performing placement positions circuit elements on the layout, and a tool performing routing defines interconnects for the circuit elements.

The components defined after placement and routing are usually then analyzed at the transistor level using an extraction tool, and verified to ensure that the circuit function is achieved and timing constraints are met. The placement and routing process can be revisited as needed in an iterative fashion. Next, the design is subjected to physical verification procedures, such as design rule checking DRC, layout rule checking LRC and layout versus schematic LVS checking, that analyze manufacturability, electrical performance, lithographic parameters and circuit correctness.

After closure on an acceptable design by iteration through design and verify procedures, like those described above, the resulting design can be subjected to resolution enhancement techniques that provide geometric manipulations of the layout to improve manufacturability. Finally, the mask data is prepared and taped out for use in producing finished products.

This design process with EDA tools includes circuitry that allows the finished product to be tested. Efficient testing of integrated circuits often uses structured design for testability (DFT) techniques. In particular, these techniques are based on the general concepts of making all or some state variables (memory elements like flip-flops and latches in the circuit) directly controllable and observable. The most-often used DFT methodology is based on scan chains. This approach assumes that during testing all (or almost all) memory elements are connected into one or more shift registers. As a result, the designed logic circuit has two or more modes of operation: a normal mode and a test, or scan, mode. In the normal mode, the memory elements perform their regular functions. In the scan mode, the memory elements become scan cells that are connected to form a number of shift registers called scan chains. These scan chains are used to shift test stimulus into a circuit under test (CUT) and shift out test responses. Applying a test pattern consists of scanning in the test stimulus, applying one or more functional clocks, and then scanning out the captured test response. The test responses are then compared to fault-free test responses to determine whether the CUT works properly.

Scan design methodology has been widely used in order to simplify testing and diagnosis. From the point of view of automatic test pattern generation (ATPG), a scan circuit can be treated as a combinational or partially combinational circuit. Today, ATPG software tools are able to generate a complete set of test patterns based on different fault models including stuck-at, transition, path delay, and bridging faults. Typically, when a particular potential fault in a circuit is targeted by an ATPG tool, only a small number of scan cells must be specified and a single scan cell needs to be observed in order to detect the particular fault. Usually, the remaining scan cells are filled with random values. In this way, the test pattern is fully specified and could detect some additional untargeted faults.

Although just a few scan cells need to be observed to detect some set of target faults for each test pattern, full observability of all scan chains is quite a desirable property for both testing and diagnosis in order to achieve high test coverage of unmodeled defects as well as high accuracy and precision in defect localization during diagnosis.

The number of test patterns and scan chains are limited by such factors as available chip I/O, available tester channels and memory, and on-chip routing congestion. Because of the growing complexity and density of the integrated circuit, reducing test data volume and test application time have become key issues for increasing quality and reducing test costs. By utilizing decompressor circuitry at the scan chain inputs and compressor circuitry at the scan chain outputs, these testing limitations are alleviated. Some of the DFT techniques for test data volume and test application time reduction use a compressor design based on code theory to compress the test responses from the scan chains. For example, linear compactors are built of exclusive-OR (XOR) or exclusive-NOR (XNOR) gates to reduce the number of test outputs of the integrated circuit. However, compactors may also mask errors in test responses from an integrated circuit. For example, the basic characteristic of an XOR (parity) tree is that any combination of odd number of errors on its inputs propagates to their outputs, and any combination of even number of errors remains undetected.

Accordingly, a compressor design has to meet the following requirements: (1) easy to specify and implement, (2) low hardware overhead with low impact on the integrated circuit, (3) logarithmic compression ratio, and (4) simple and reliable mechanism for error detection and identification. However, satisfying all these requirements is quite challenging. In particular, it is necessary to ensure that compressed test responses obtained from faulty and fault-free circuits are different. This phenomenon is known as error masking or aliasing. An example of error masking occurs when multiple errors exist in test responses coming from scan chains in a faulty CUT. The multiple errors could mask one another, resulting in a compressed test response or a signature that is the same as the signature for a fault-free circuit.

Unknown values also add complexity in error detection and identification. For example, an unknown value on one or more inputs of an XOR tree generates unknown values on its output, and consequently masks propagation of errors on other inputs. This phenomenon is known as X-masking effect.

Therefore an efficient compressor should generate a faulty signature even when unknown values and/or multiple errors exist in the test responses, and allow efficient and reliable identification of multiple errors in the test responses for the purposes of diagnosis.

SUMMARY

Full scan is a widely used design-for-test technique that enables high quality test pattern generation for both testing and diagnosis of the integrated circuits. However, the cost of scan testing is becoming prohibitive because of the increasing number of scan flops in the designs and the complexity of defect behaviors. The problem is compounded by the fact that the bandwidth available at the input and the output sides is limited due to the number of available test pins and tester channels. On-chip compressor/decompressor circuits loading/unloading multiple scan chains in parallel have addressed the problem of increasing test data volume and test application time.

Most output compression schemes like linear feedback shift registers (LFSR), multi input shift registers (MISR), circular paths and compactors have good error masking properties. However, most of these schemes have difficulties with compressing test responses having unknown values (or Xs). Also most of these schemes do not allow efficient diagnosis in compression mode.

Proposed are methods and apparatuses for synthesis of a new class of compressors, called here augmented multimode compactors, capable of achieving a flexible trade-off between compaction ratio, observability, control data volume and diagnostic properties in the presence of a large number of unknown values. Distinctive features of the augmented multimode compactors are to reduce and/or completely avoid the X-masking effect in the compacted test responses. In addition, a requirement for constructing compactors is that any single error in the test response produces a unique erroneous signature within S consecutive shift cycles where the erroneous signature is calculated as a difference between the faulty signature and the fault-free signature. A range of the compactor determines the maximum amount test response data such that any single error will produce a unique erroneous signature. Accordingly, S is equal to 1 for combinational compactors and S>1 for sequential compactors. As a result, any double error and/or any odd number of errors within the compactor range will produce a faulty signature. Challenges for constructing sequential compactors are: 1) maximize the compactor range; 2) reduce the error masking effect for even number (4 or more) of errors; 3) reduce or completely avoid unknown values in scan chains selected for compression while maximizing observability and minimizing the amount of control data; and 4) allow efficient diagnosis in compression mode.

One aspect of the technology is an apparatus. The apparatus comprises an integrated circuit including circuitry compacting test response data from scan chains in the integrated circuit under test. The circuitry comprises a first set of logic gates coupled to the scan chains; and a first plurality of output registers receiving the test response data from the scan chains via the first set of logic gates, said first plurality of output registers including sequential elements and a second set of logic gates that process the test response data with stored data in said output registers. Groups of the scan chains are coupled to output registers of said first plurality of output registers, such that a same group of the groups of the scan chains is coupled to sequential elements of different output registers of said first plurality of output registers.

In an embodiment, the circuitry further comprises a second plurality of output registers receiving the test response data from the scan chains via the first set of logic gates, said second plurality of output registers including sequential elements and a third set of logic gates that process the test response data with stored data in said output registers, said second plurality of output registers being different from said first plurality of output registers. Groups of the scan chains are coupled to output registers of said second plurality of output registers, such that different groups of the groups of the scan chains are coupled to sequential elements of different output registers of said second plurality of output registers.

In an embodiment, at least two output registers of the first plurality of output registers have lengths of sequential elements, and wherein the lengths have a greatest common divisor of 1.

In an embodiment, at most one scan chain is shared between the groups of the scan chains coupled to the sequential elements of the different output registers of said first plurality of output registers.

In an embodiment, at least one output register of the first plurality of output registers has at most one feedback loop.

In an embodiment, at least two registers of the first plurality of output registers are coupled to each other sequentially.

In an embodiment, at least two registers of the first plurality of output registers are coupled to each other sequentially and said at least two registers of the first plurality of output registers have at least common feedback loop.

One aspect of the technology is a computer-implemented method. The method comprises:

dividing a plurality of scan chains among at least groups and a plurality of partitions, the plurality of scan chains in an integrated circuit under test, the plurality of scan chains processing test response data, such that:

(i) the groups disallow sharing a common scan chain from the plurality of scan chains, within a particular partition of the plurality of partitions, and (ii) at least one common scan chain is shared between the groups of different partitions of the plurality of partitions, such that the groups of a first partition of the plurality of partitions share at least one common scan chain with at least one group of a second partition of the plurality of partitions; and based on at least said dividing, selectively compressing test response data from the plurality of scan chains over a plurality of shift cycles.

In an embodiment, at least one common scan chain is shared between all the groups of different partitions of the plurality of partitions, such that each group of the first partition of the plurality of partitions shares at least one common scan chain with each group of the second partition of the plurality of partitions.

In an embodiment, at most one common scan chain is shared between the groups of different partitions of the plurality of partitions.

An embodiment further includes defining a set of instructions including at least a mode field, a direct selection field, and an indirect selection field, wherein the mode field in an instruction of the set of instructions has a mode valid for one or more shift cycles specifying the meaning of other fields in the instruction, wherein scan chains selected for compression by the instruction are defined for a particular shift cycle as an intersection of scan chains specified by the indirect selection field and the direct selection field for the particular shift cycle.

In an embodiment the indirect selection field is valid for one or more shift cycles. The indirect selection field is applied to the plurality of partitions, and the indirect selection field specifies at least one of: (i) the plurality of scan chains, (ii) no scan chains of the plurality of scan chains, (iii) at least one group of the groups of scan chains associated with a particular partition of the plurality of partitions, (iv) an intersection of at least two groups of the groups of scan chains each associated with at least two partitions of the plurality of partitions, and (v) a sequence of intersection and union operations of at least two groups of the groups of scan chains associated with the plurality of partitions.

In an embodiment the direct selection field is applied to at most one partition of the plurality of partitions, and specifies a combination of the groups of scan chains associated with said at most one partition for a shift cycle.

One aspect of the technology is a computer-implemented method. The method includes:

synthesizing a compactor circuit in the integrated circuit including an input sector, and space compactor, including:

dividing a plurality of scan chains among at least groups and partitions, the plurality of scan chains in an integrated circuit under test, the plurality of scan chains processing test response data, the partitions include a first plurality of partitions and a second plurality of partitions such that:

(i) within partitions of the first plurality of partitions, the groups disallow sharing a common scan chain from the plurality of scan chains, (ii) within partitions of the second plurality of partitions, the groups disallow sharing a common scan chain from the plurality of scan chains, (iii) at least one common scan chain from the plurality of scan chains is shared between: the groups of different partitions of the first plurality of partitions, such that the groups of a first partition of the first plurality of partitions share at least one common scan chain with at least one group of a second partition of the first plurality of partitions and (iv) at least one common scan chain from the plurality of scan chains is shared between: the groups of different partitions of the second plurality of partitions, such that the groups of a first partition of the second plurality of partitions share at least one common scan chain with at least one group of a second partition of the second plurality of partitions; and based on the first plurality of partitions, synthesizing an input selector;

based on the second plurality of partitions, synthesizing a space compactor, wherein (i) partitions of said second plurality of partitions correspond to groups of outputs of the space compactor, such that some partition of said second plurality of partitions corresponds to some group of outputs of the space compactor, and wherein (ii) partitions of said second plurality of partitions specify particular groups of the groups of the plurality of scan chains, and (iii) said specified particular groups are observable at same outputs within the corresponding groups of outputs, such that a first specified particular group of scan chains is observable at a same output within the corresponding group of outputs.

In an embodiment at least one common scan chain of the plurality of scan chains is shared between the groups of a set of partitions, the set of partitions including the first plurality of partitions and the second plurality of partitions, such that each group of a first partition of the set of partitions shares at least one common scan chain with each group of a second partition of the set of partitions.

In an embodiment at most one scan chain of the plurality of scan chains is shared between the groups of a set of partitions, the set of partitions including a subset of the second plurality of partitions excluding at most one partition from the second plurality of partitions.

In an embodiment at most one scan chain of the plurality of scan chains is shared between the groups of a set of partitions, the set of partitions including the first plurality of partitions and at most one partition of a subset of the second plurality of partitions, the subset of the second plurality of partitions excluding at most one partition from the second of plurality of partitions.

One embodiment further includes synthesizing a plurality of output registers coupled to the groups of outputs of the space compactor, wherein at least two output registers of the plurality of output registers are coupled to a same group of the groups of outputs of the space compactor.

One embodiment further includes synthesizing a plurality of output registers coupled to the groups of outputs of the space compactor, wherein at least two output registers of the plurality of output registers are coupled to different groups of the groups of outputs of the space compactor.

One embodiment further includes synthesizing a plurality of output registers coupled to the groups of outputs of the space compactor, wherein the plurality of output registers have quantities of sequential elements and wherein the quantities of at least two output registers of the plurality of output registers have a greatest common divisor different than 1.

The aspects of the technology disclosed herein are applicable to at least an apparatus, a method, and a computer readable medium.

BRIEF DESCRIPTION OF THE DRAWINGS

FIG. 2 is a functional specification of AMC(3,3,1,2) using two output mappings.

FIG. 3 is a table of mapping equations of AMC(N,K,Q,T) for N prime, $K \leq U$, $T \leq N$ and $Q \leq \lfloor K/2 \rfloor$.

FIG. 4 is a functional specification of AMC(3,3,1,2) using single output mapping.

FIG. 5 shows a synthesis procedure for AMC(4,4,1,2).

FIG. 6 shows a synthesis procedure for AMC(4,4,2,3).

FIG. 7 shows a synthesis procedure for AMC(4,6,3,0).

FIG. 13 is a table of an extended set of modes.

FIG. 14 shows a structure of commands for the control block.

FIG. 20 is a graph showing simulation results for the infinite AMC(N,4,2,3) in Example 7 when N={3, 4, . . . , 13}.

FIG. 21 is a graph showing simulation results for the infinite AMC(N,4,2,3) in Example 10 when N={3, 4, . . . , 13}.

DETAILED DESCRIPTION

Figure 1:
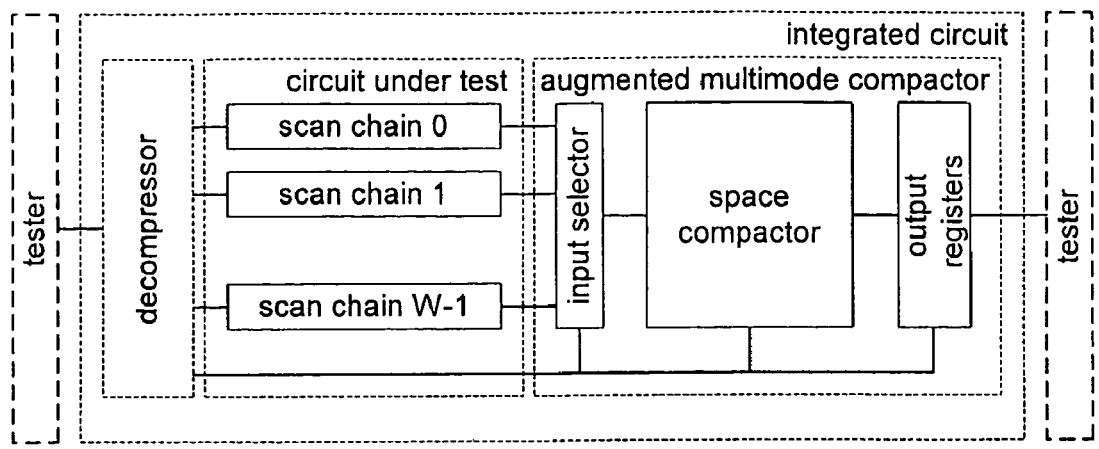
FIG. 1 is a block diagram of the integrated circuit with an augmented multimode compactor (AMC).

A block diagram of an integrated circuit having an on-chip test capability is given in FIG. 1. Accordingly, a tester is coupled to an integrated circuit having a CUT, a decompressor, and an AMC used as an output compressor of the test responses of the CUT. The CUT has W scan chains having one or more scan cells which are coupled to a space compactor through an input selector. The AMC has an input selector, a space compactor and (optionally) one or more output registers. The input selector and the space compactor are combinational blocks (including AND, NAND, OR, NOR, XOR and/or NXOR gates) and are coupled to the decompressor or/and the tester outputs through a control block. The output registers are sequential blocks (including AND, NAND, OR, NOR, XOR, NXOR gates and flip-flops) and are coupled to the decompressor or/and the tester outputs through control blocks (not shown in FIG. 1).

The following examples are specific non-limiting examples illustrating various features for synthesis of augmented multimode compactors. Only a subset of features demonstrated in a single example may be in an embodiment of the presented technology. An embodiment of the technology may include features from multiple examples.

Example 1

FIG. 2 shows a functional specification of a combinational AMC of a CUT having 27 scan chains. Accordingly, the scan chains are viewed as a 3-dimensional array {r×c×b} and a triplet (x,y,z) is assigned to a scan chain in row x, column y and block z where x={0,1,2}, y={0,1,2} and z={0,1,2}. Scan chains in the same block and the same column form a cluster. An input selector is constructed by two partitions $P_0$ and $P_1$ such that each partition specifies a mapping of scan chains into three groups of scan chains {$G_{00}$, $G_{01}$, $G_{02}$} and {$G_{10}$, $G_{11}$, $G_{12}$}, respectively, in a way that each group of scan chains has at most one scan chain in each cluster. Accordingly, partitions map up to $N^3$ scan chains into N groups in a way that at most N scan chains belong to the same group for both partitions are called here orthogonal. Partitions map scan chains into N groups such that each group has at most one scan chain in each cluster are called here a first type. Next, three modes $M_0$, $M_1$ and $M_2$ are defined such that all scan chains, a group of scan chains or an intersection of two groups of scan chains is selected for compression. Accordingly, in mode $M_0$, all scan chains are selected for compression. In mode $M_1$, a group of scan chains associated with one partition is selected for compression. In mode $M_2$, an intersection of two groups of scan chains associated with different partitions is selected for compression.

AMC has 2 output mappings, A and B, constructed by partitioning outputs of the space compactor into three groups of outputs $O_0$, $O_1$, and $O_2$. Next, each output mapping specifies a set of three outputs (a,b,c) which are assigned for observation of each scan chain (x,y,z) in a way that the first, second and third output belongs to group of outputs $O_0$, $O_1$ and $O_2$, respectively. An output mapping is unique if sets of outputs assigned for observation to scan chains selected for compression are different within at least one group of outputs (e.g, $O_0$, $O_1$ and/or $O_2$). Accordingly, output mapping is defined by a set of partitions $O_0$, $O_1$, . . . , $O_{K-1}$ such that partition $O_i$ maps scan chains into N groups in a way that the j-th group of scan chains is observable at the j-th output of the corresponding group of outputs where i=0, 1, . . . , K−1 and j=0, 1, . . . , N−1. Each output mapping is associated with a particular mode $M_0$, $M_1$ or $M_2$ and certain desirable properties of the AMC are optimized.

Output mapping A is unique and optimized with respect to mode $M_0$. Accordingly, output mapping A defines a unique set of three outputs assigned for observation to each scan chain in a way that each one of the three outputs belongs to a different group of outputs $O_0$, $O_1$ or $O_2$. Output mapping A is constructed using three mutually exclusive partitions associated with groups of outputs $O_0$, $O_1$ and $O_2$ which one mapping the scan chains into N groups in a way that at most one scan chain belongs to the same group for all partitions. As a result, an error in a scan chain selected for compression is observable at one or more of the outputs of the AMC when any one unknown value exists in the same shift cycle. Accordingly, the AMC can tolerate one unknown value in this mode.

Output mapping B is unique and optimized with respect to mode $M_1$. In mode $M_1$, either a group of scan chains $G_{00}$, $G_{01}$ and $G_{02}$ associated with partition $P_0$ or a group of scan chains $G_{10}$, $G_{11}$ and $G_{12}$ associated with partition $P_1$ can be selected for compression. Accordingly, output mapping B defines for each cluster a unique set of three outputs belonging to three different groups of outputs $O_0$, $O_1$ or $O_2$ in a way that the sets of outputs assigned for observation of a pair of clusters share at most 1 common output. Output mapping B is constructed using 3 mutually orthogonal partitions $O_0$, $O_1$ and $O_2$ mapping the scan chains into N groups in a way that at most N scan chains belong to the same group for all partitions. Partitions map scan chains into N groups such that scan chains in each cluster belong to the same group are called here a second type. Clearly, any mutually exclusive set of partitions includes at least three partitions from two different types. Also, a pair of partitions from different types is orthogonal. As a result, each unknown value may mask an error in a scan chain within at most one group of outputs (e.g, $O_0$, $O_1$ and/or $O_2$). Therefore, in this mode, an error in a scan chain selected for compression is observable at one or more of the outputs of the AMC when any K−1 unknown values exist in the same group of scan chains and the same shift cycle. In this case, we said that AMC can tolerate K−1 unknown values with respect to each partition for selection $P_0$, $P_1$, ..., $P_{T-1}$. In addition, output mapping B is optimized, if the sets of outputs assigned for observation of scan chains in an intersection of two groups of scan chains do not share any common output, within any group of outputs. In this case, the X-masking effect between these scan chains is impossible and we may consider that each chain is the only scan chain in the intersection of two groups of scan chains. As a result, in mode $M_1$, at least $T_0+T_1+2$ unknown values in the same shift cycle are necessary to mask an error in a scan chain with respect to all partitions for selection and all outputs assigned for observation of this chain where $T_0$ and $T_1$ are the numbers of unknown values that the AMC can tolerate with respect to partitions $P_0$ and $P_1$. Accordingly, the AMC can tolerate KT−1 unknown values in this mode.

Output mapping B is unique and optimized with respect to mode $M_2$. More precisely, output mapping B defines a unique set of three outputs for observation of each cluster in a way that the scan chains within the intersection of two groups of scan chains do not share any common output within any group of outputs. As a result, an error in a scan chain selected for compression in mode $M_2$ is observable at three outputs of the AMC when all other scan chains have unknown values in the same shift cycle. Accordingly, we said that AMC can tolerate any number of unknown values in this mode.

For instance, scan chain (0,0,0) belongs to groups of scan chains $G_{00}$ and $G_{10}$ together with 8 other scan chains for partitions $P_0$ and $P_1$, respectively. Next, three non-overlapping sets of outputs (0,0,0), (1,1,2) and (2,2,1) are assigned for observation of scan chains (0,0,0), (0,0,1) and (0,0,2) in the intersection of groups of scan chains $G_{00}$ and $G_{10}$, respectively. Therefore, the X-masking effect between scan chains (0,0,0), (0,0,1) and (0,0,2) is impossible. By excluding these three scan chains, the remaining 6 scan chains in groups $G_{00}$ and $G_{10}$ are non-overlapping and any 2 unknown values can be tolerated within each one of these groups of scan chains. Next, the X-masking effect with respect to scan chain (0,0,0) can be further reduced by choosing either partition $P_0$ or $P_1$. The choice of partition ($P_0$ or $P_1$) for selecting scan chain (0,0,0) for compression can be based on the number of unknown values in the remaining 6 scan chains of groups of $G_{00}$ and $G_{10}$ and a group of scan chains having at most 2 unknown values need to be selected. Since the above mentioned conditions are satisfied with respect to each scan chain then the total number of unknown values that can be tolerated in mode $M_1$ is equal to 5.

The ATPG tool applies the above criteria when selecting scan chains for compression for each shift cycle in the following sequence: (1) generate the test pattern for a set of faults and determine scan cells for compression under an assumption that at most one group of scan chains can be selected for compression for each shift cycle; (2) simulate test pattern and identify the distribution of the unknown values; (3) for each shift cycle, choose a mode that maximizes the observability and minimizes the X-masking effect with respect to chains initially determined for compression.

FIG. 3 gives a generic specification of combinational AMC (N,K,Q,T) for N prime where N is the number of groups of scan chains in one partition, K is the number of groups of outputs (partitions for observation), Q is the number of unique groups of outputs for observation of scan chains within one cluster, T is the number of partitions for selection, $K \leq N$, $T \leq N$ and $Q \leq \lfloor K/2 \rfloor$. A typical AMC(10,3,1,2) has 1000 scan chains observable at 30 outputs, i.e., a compression ratio is 33, such that 1000, 100 and 10 scan chains can be selected for compression in mode $M_1$, $M_2$ and $M_3$, respectively. Accordingly, $N^3$ scan chains in a CUT are viewed as a 3-dimensional array {r×c×b} and a triplet (x,y,z) is assigned to a scan chain in row x, column y and block z where x={0, 1, 2, ..., N−1}, y={0, 1, 2, ..., N−1} and z={0, 1, 2, ..., N−1}. Scan chains in the same block and column form clusters $C_0$, $C_1$, ..., $C_{N-1}^2$. T mutually orthogonal partitions $P_0$, $P_1$, ..., $P_{T-1}$ from the first type are defined such that each partition specifies a mapping of the scan chains into N groups of scan chains {$G_{00}$, $G_{01}$, ..., $G_{0,N-1}$}, {$G_{10}$, $G_{11}$, ..., $G_{1,N-1}$}, ..., {$G_{T-1,0}$, $G_{T-1,1}$, ..., $G_{T-1,N-1}$}, respectively. Accordingly, 1) each group of scan chains has at most one scan chain in each cluster, and 2) each group of scan chains in the first partition shares at most one scan chain with each group of scan chains in the second partition within each block. As a result, at most one scan chain from each block belongs to the same group for all partitions. Next, three modes $M_0$, $M_1$ and $M_2$ are defined such that all scan chains, a group of scan chains or an intersection of two groups of scan chains is selected for compression. Two output mappings are constructed by partitioning the outputs into K groups of outputs $O_0$, $O_1$, $O_{K-1}$ and certain desirable properties are optimized for each mode. Output mapping A is constructed by K mutually orthogonal partitions such that partition $O_0$ is from the first type and K−1 partitions $O_1$, ..., $O_{K-1}$ from the second type. As a result, AMC(N,K,Q,T) can tolerate one unknown value in mode $M_0$. Output mapping B is associated with mode $M_1$ and $M_2$ and a unique set of K outputs are assigned for observation to each cluster. Output mapping B is optimized if sets of outputs assigned for observation of a pair of clusters share at most 1 common output. Output mapping B is constructed by K mutually orthogonal partitions $O_0$, $O_1$, ..., $O_{K-1}$ from the second type. As a result, AMC(N,K,Q,T) can tolerate K−1 unknown values with respect to each partition $P_0$, $P_1$, ..., $P_{T-1}$. In addition, output mapping B is optimized if sets of outputs assigned for observation of scan chains within an intersection of two groups of scan chains do not share any common output. As a result, AMC(N,K,Q,T) can tolerate KT−1 unknown values in mode $M_1$ and any number of unknown values in mode $M_2$.

In summary, in mode $M_0$, all $N^3$ scan chains are selected for compression and AMC(N,K,Q,T) can tolerate one unknown value. In mode $M_1$, a group of N scan chains associated with a partition $P_0$, $P_1$, ..., $P_{T-1}$ is selected for compression and AMC(N,K,Q,T) can tolerate KT−1 unknown values (K−1 unknown values with respect to each partition). In mode $M_2$, N scan chains within an intersection of two groups of scan chains are selected for compression and AMC(N,K,Q,T) can tolerate any number of unknown values.

Example 2

FIG. 4 illustrates constructing a combinational AMC(N,K,Q,T) using a single output mapping where N=3, K=3, Q=1 and T=2. Input selector is constructed by T mutually orthogonal partitions $P_0$, $P_1$, ..., $P_{T-1}$ from the first type. Output mapping is constructed using K−1 mutually orthogonal partitions $O_1$, $O_2$, ..., $O_{K-1}$ from the second type and one partition $O_0$ from the first type. Also, partitions $P_0$, $P_1$, ..., $P_{T-1}$ for selection and $O_0$, $O_1$, ..., $O_{K-1}$ for observation are mutually orthogonal. In this way, in mode $M_1$, K−1 unknown values can be tolerated with respect to each partition $P_0$, $P_1, \ldots, P_{T-1}$. Any pair of scan chains in the intersection of two groups of scan chains shares at most 1 common output with respect to group of outputs $O_0$. As a result, AMC(N,K,Q,T) can tolerate T(K−1) unknown values in this mode. The worst case is when an error and at least one unknown value exist in the intersection of two groups of scan chains. In this case, since the scan chains in the intersection of two groups share a common output with respect to group of outputs $O_0$ then the error will be masked with respect to this group of outputs. By excluding group of outputs $O_0$, the compactor can still tolerate at least K−2 unknown values with respect to the remaining groups of outputs $O_1, O_2, \ldots, O_{K-1}$ for each partition $P_0$, $P_1, \ldots, P_{T-1}$. As a result, at least T(K−1)+1 unknown values are necessary to mask the error under consideration with respect to all partitions $P_0, P_1, \ldots, P_{T-1}$ and the remaining K−1 groups of outputs $O_1, O_2, \ldots, O_{K-1}$. Therefore, AMC (N,K,Q,T) can tolerate T(K−1) unknown values.

In summary, in modes $M_0$ and $M_2$, AMC(N,K,Q,T) using a single output mapping can tolerate one unknown value and any number of unknown values, respectively. As a result, AMC(N,K,Q,T) using a single output mapping simplifies the compactor architecture but it can tolerate less unknown values in mode $M_1$.

Example 3

Figure 5:
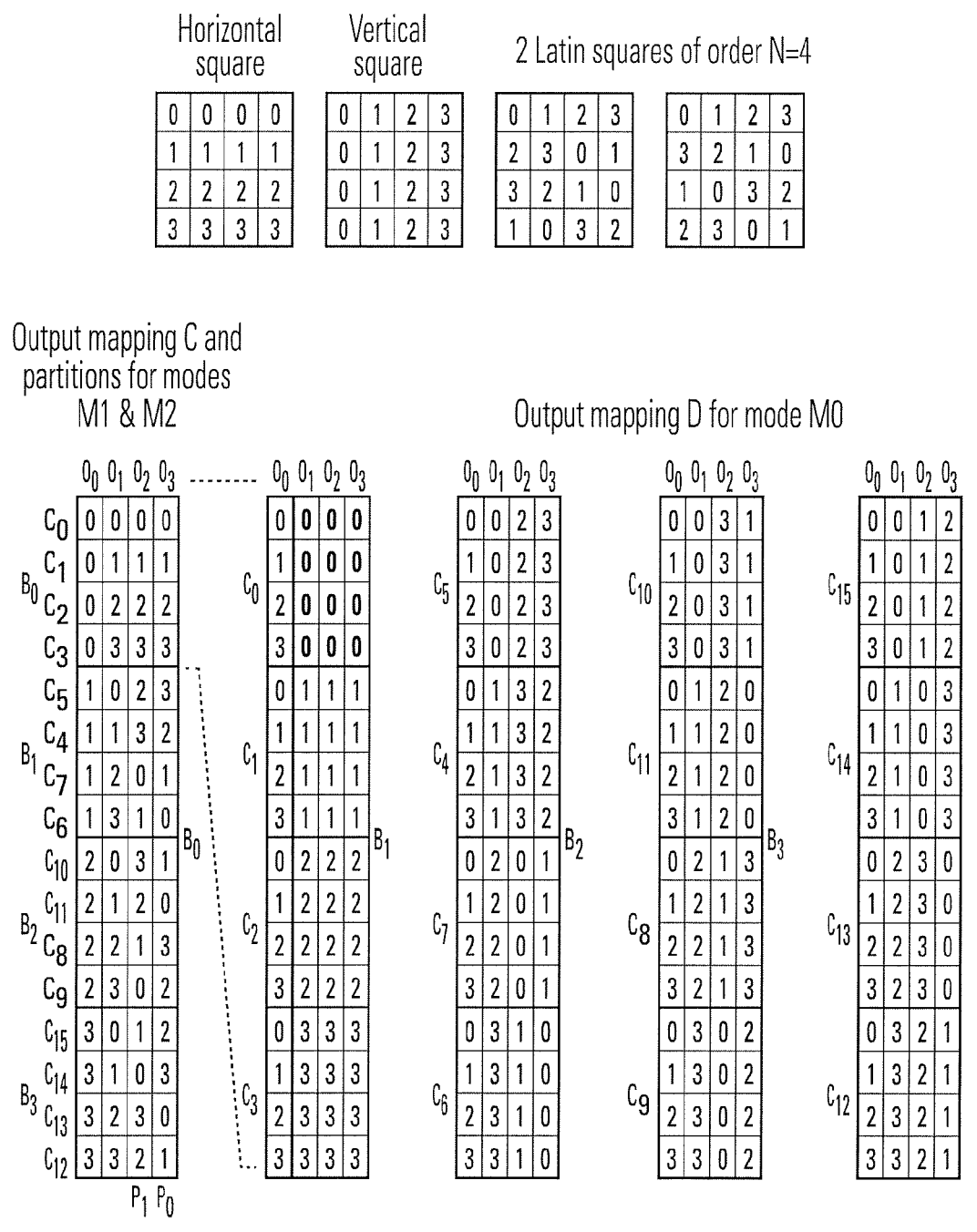

FIG. 5 illustrates a synthesis procedure for a combinational AMC(N,K,Q,T) when N=4, K=4, Q=1 and T=3. First, horizontal, vertical and 2 orthogonal Latin squares of order 4 are constructed. Accordingly, the horizontal square and the vertical square of order N contain integers $0, 1, 2, \ldots, N-1$ so that each integer occurs in exactly one row and exactly one column of the array, respectively. Also, a Latin square of order N is a square array of size N containing integers $0, 1, 2, \ldots, N-1$ so that each integer occurs exactly once in every row and in every column of the array. 2 Latin squares of order N are said to be orthogonal if one can be superimposed on the other, and each of the $N^2$ pairs of integers (taking the order into account) occurs exactly once in the $N^2$ cells of the array.

Next, starting from the left to the right and the top to the bottom, each square is arranged as a single column and an array {4×16} is constructed, called here the first array, as it is shown in FIG. 5. Each column of the first array {4×16} defines a partition into N groups from the second type which is associated with group of outputs $O_0, O_1, O_2$ and $O_3$, respectively. Rows 0, 1, 2 and 3 of the first array {4×16} correspond to block $B_0$, rows 4, 5, 6 and 7 of the first array {4×16} correspond to block $B_1$, rows 8, 9, 10 and 11 of the first array {4×16} correspond to block $B_2$ and rows 12, 13, 14 and 15 of the first array {4×16} correspond to block $B_3$. Also, rows 0, 1, 2 and 3 of the first array {4×16} correspond to clusters $C_0, C_1, C_2$ and $C_3$ of block $B_0$, respectively. Next, for $i=\{1, 2, \ldots, N-1\}$, clusters $C_{4i}, C_{4i+1}, \ldots, C_{4i+3}$ are assigned to the rows in block $B_i$ of the first array {4×16} so that clusters having the same indexes by module N contains different integers in the corresponding cells. FIG. 5 shows an assignment between the clusters and the rows of the first array {4×16}. As a result, output mapping for modes $M_1$ and $M_2$ is completely specified. More precisely, since 4 partitions are mutually orthogonal then the first array {4×16} defines an unique set of 4 outputs (at most one from each group of outputs) assigned for observation for each cluster such that a pair of clusters share at most 1 common output within any group of outputs; and a pair of clusters having the same indexes by module N, i.e., clusters in the intersection of two groups of scan chains, do not share any common output. In addition, the second, third and fourth columns in the first array {4×16} respectively specify three mutually orthogonal partitions $P_2$, $P_1$ and $P_0$ of the scan chains into groups of scan chains valid for all blocks, i.e., from the first type.

Finally, a second array {4×64} that specifies output mapping for mode $M_0$, is constructed by expanding each row in the first array {4×16} into four rows in the second array {4×64} in a way that the second, third and fourth columns in the first array {4×16} each specify 3 common outputs assigned for observation to all scan chains within a cluster with respect to groups of outputs $O_1$, $O_2$ and $O_3$ and the second column in the first array {4×16} specifies 1 unique output assigned for observation to scan chains in this cluster with respect to group of outputs $O_o$. In other words, output mapping for mode $M_0$ is constructed using four mutually orthogonal partitions including one partition from the first type associated with group of outputs $O_0$ and three partitions from the second type associated with groups of outputs $O_1$, $O_2$ and $O_3$. As a result, the sets of outputs assigned for observation to the scan chains in one cluster are unique within group of outputs $O_0$, called here first type of outputs, and share at most K−Q common outputs within each group of outputs $O_1$, $O_2$ and $O_3$, called here second type of outputs. Also, the sets of outputs assigned for observation to the scan chains in different clusters share at most Q common outputs from the first type and at most one common output from the second type. In other words, the set of outputs assigned for observation to each scan chain includes Q outputs from the first type and K−Q outputs from the second type. The resulting output mapping D is unique and AMC can tolerate one unknown value in mode $M_0$. When N is odd, output mapping D can be constructed using the following equations: x, y, (y+z)mod N and (y+2z)mod N where N is the number of groups of scan chains for each partition and each equation determines an output in the corresponding group of outputs which is assigned for observation of scan chain (x, y, z). Respectively, input selector can be constructed using the following equations: (x+y)mod N and (x+2y)mod N where N is the number of groups of scan chains for each partition and each equation determines a group of scan chains associated with this partition for selection of scan chain (x, y, z).

In summary, the above procedure is an informal proof that the synthesis of combinational AMC(N,K,Q,T) that can tolerate one unknown value in mode $M_0$, KT−1 unknown values in mode $M_1$ and any number of unknown values in mode $M_2$ is possible using two output mappings if at least H mutually orthogonal Latin squares of order N exist where K≦H+2≦N, T≦H+1 and Q=1.

Also, the above procedure is an informal proof that the synthesis of combinational AMC(N,K,Q,T) that can tolerate one unknown value in mode $M_0$, T(K−1) unknown values in mode $M_1$ and any number of unknown values in mode $M_2$ is possible using a single output mapping if at least H mutually orthogonal Latin squares of order N exist where K+T≦H+1 and Q=1.

Example 4

Figure 6:
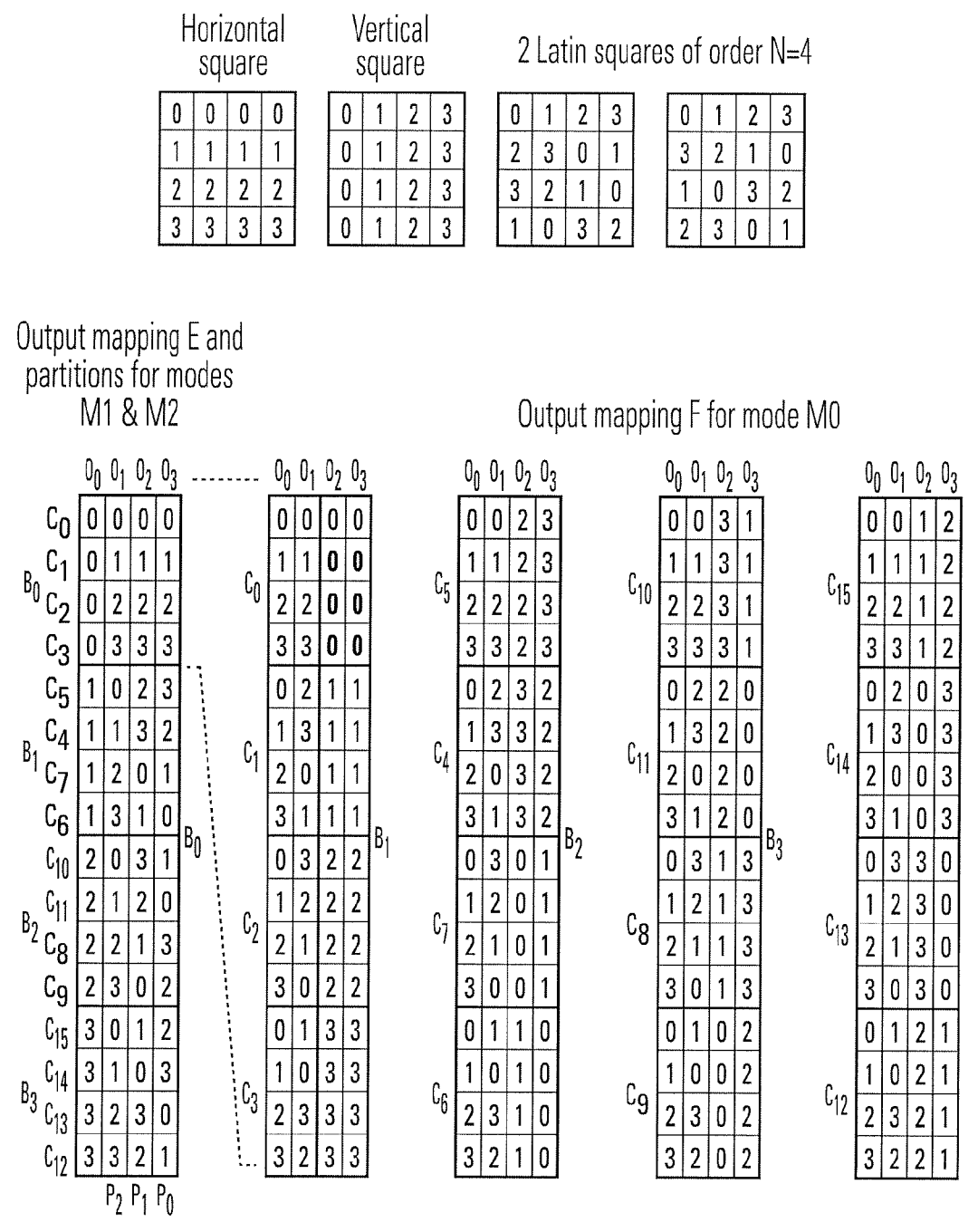

FIG. 6 illustrates a synthesis procedure for a combinational AMC(N,K,Q,T) when N=4, K=4, Q=2 and T=3. Similarly, the first array is constructed based on horizontal and vertical squares and 2 orthogonal Latin squares, all of order N. A second array {4×64} that specifies output mapping for mode $M_0$ is constructed by expanding each row (or cluster) in the first array {4×16} into four rows in a way that the sets of outputs assigned for observation to the scan chains in each cluster are unique within groups of outputs $O_0$ and $O_1$, and share at most K−Q common outputs with respect groups of outputs $O_2$ and $O_3$. In other words, two types of outputs are defined such that groups of outputs $O_0$ and $O_1$ are associated with 2 orthogonal partitions from the first type and groups of outputs $O_2$ and $O_3$ are associated with 2 orthogonal partitions from the second type. Accordingly, the scan chains in one block share at most one output with respect to the first type of outputs. Also, a pair of scan chains in different clusters may share at most one output with respect to the second type of outputs. Resulting output mapping F is unique and AMC can likely tolerate 2 unknown values in mode $M_0$. When N is odd, output mapping F can be constructed using the following equations: x, (x+y)mod N, (y+z)mod N and (y+2z)mod N where N is the number of groups of scan chains for each partition and each equation determines an output in the corresponding group of outputs which is assigned for observation of scan chain (x, y, z).

In summary, the above procedure is an informal proof that the synthesis of the combinational AMC(N,K,Q,T) that can likely tolerate 2 unknown values in mode $M_0$, KT−1 unknown values in mode $M_1$ and any number of unknown values in mode $M_2$ is possible using two output mappings if at least H mutually orthogonal Latin squares of order N exist where K≦H+2≦N, T≦H+1 and 1≦Q≦⌊K/2⌋.

Also, the above procedure is an informal proof that the synthesis of the combinational AMC(N,K,Q,T) that can likely tolerate 2 unknown values in mode $M_0$, T(K−Q) unknown values in mode $M_1$ and any number of unknown values in mode $M_2$ is possible using a single output mapping if at least H mutually orthogonal Latin squares of order N exist where K≦H+2≦N, K+T≦H+1 and 1≦Q≦⌊K/2⌋.

Example 5

Figure 7:
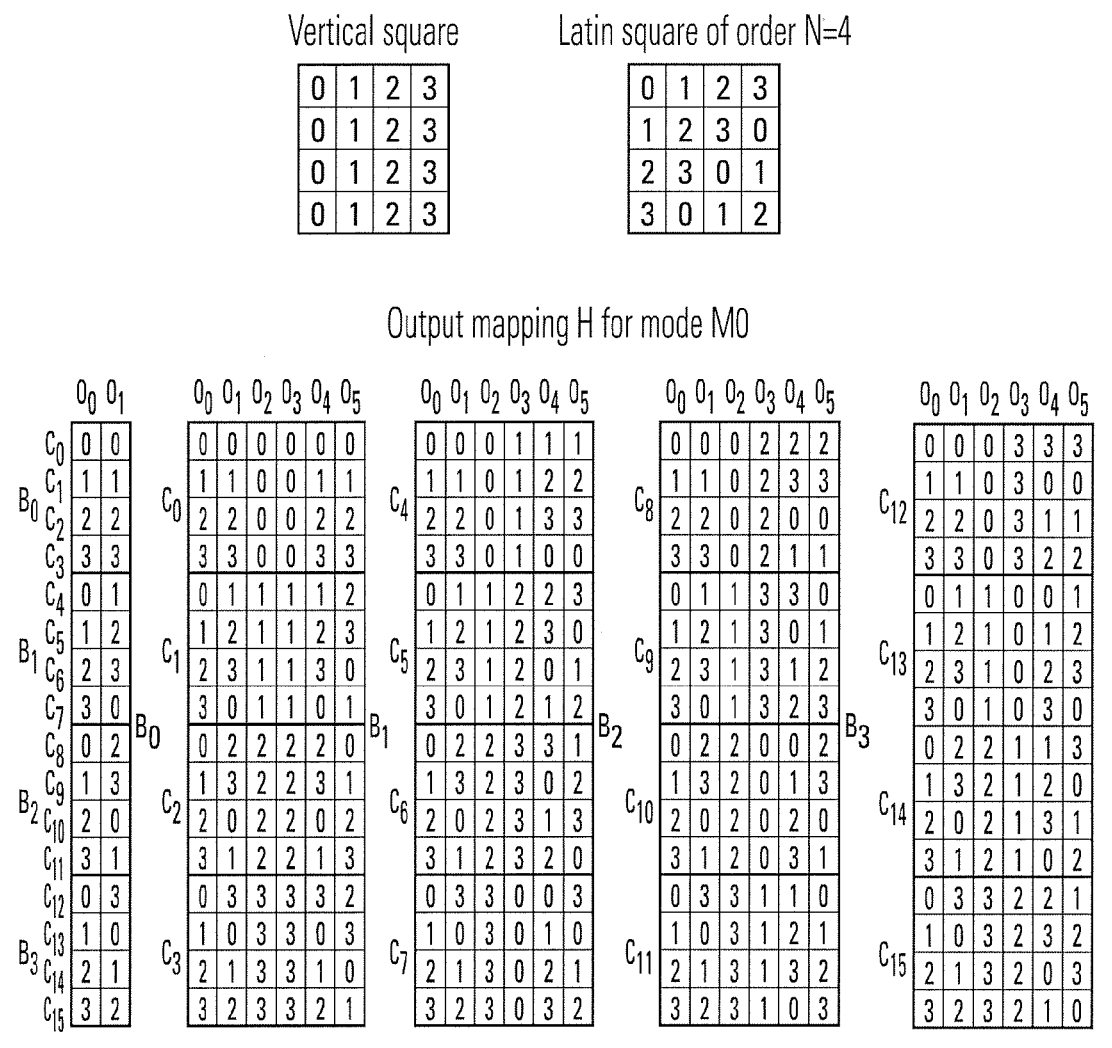

FIG. 7 illustrates constructing an output mapping for mode $M_0$ that can tolerate 2 unknown values in one shift cycle when N=4 and K=6. Similarly, a first array {4×16} is constructed based on a vertical square and Latin square L(x,y)=x+y all of order 4. Next, a second array {6×64} is constructed based on the first array {4×16} in a way that the outputs assigned for observation to the scan chains in each cluster are unique within each group of outputs $O_0$ and $O_1$, called here first type, and common within each group of outputs $O_2$ and $O_3$, called here second type. Next, groups of outputs $O_4$ and $O_5$, called here third type, are constructed by combining a group of outputs $O_1$ from the first type with each one of groups of outputs $O_2$ and $O_3$ from the second type. As a result, a set of partitions $O_0$, $O_1$, . . . , $O_5$ are mutually orthogonal. The resulting output mapping H is unique and AMC can tolerate 2 unknown values in mode $M_0$. For N≧3, output mapping H can be constructed using the following equations: x, (x+y)mod N, y, (y+z)mod N, (x+y+z)mod N, (x+2y+z)mod N where N is the number of groups of scan chains for each partition and each equation determines an output in the corresponding group of outputs which is assigned for observation of scan chain (x, y, z). Similarly, a complete set of up to 7 mutually orthogonal partitions can be constructed using the following equations: {x, (x+y)mod N, z, (z+x)mod N, (x+y+z)mod N, (2x+y+z)mod N}, {y, (y+z)mod N, z, (z+x)mod N, (x+y+z)mod N, (x+y+2z)mod N} and {x, (x+y)mod N, y, (y+z)mod N, z, (z+x)mod N, (x+y+z)mod N}.

In summary, the above procedure is an informal proof that the synthesis of an output mapping for mode $M_0$ that can tolerate 2 unknown values per shift cycle can be constructed using mutually orthogonal partitions for any N≧3 when K≧6.

For constructing sequential compactors, any single error in test responses need to produce a unique erroneous signature within at least L consecutive shift cycles where L is a latency of the sequential compactor which is defined as a maximum shift cycles that are required for an error to be stored into a sequential element of the sequential compactor that is either directly observable from an output of the integrated circuit or has two or more feedback loops to two or more sequential elements. Accordingly, a necessary condition for constructing sequential AMC is that an output mapping is defined by at least four mutually orthogonal partitions such that at least three subsets of three partitions are also mutually exclusive.

Example 6

Figure 8:
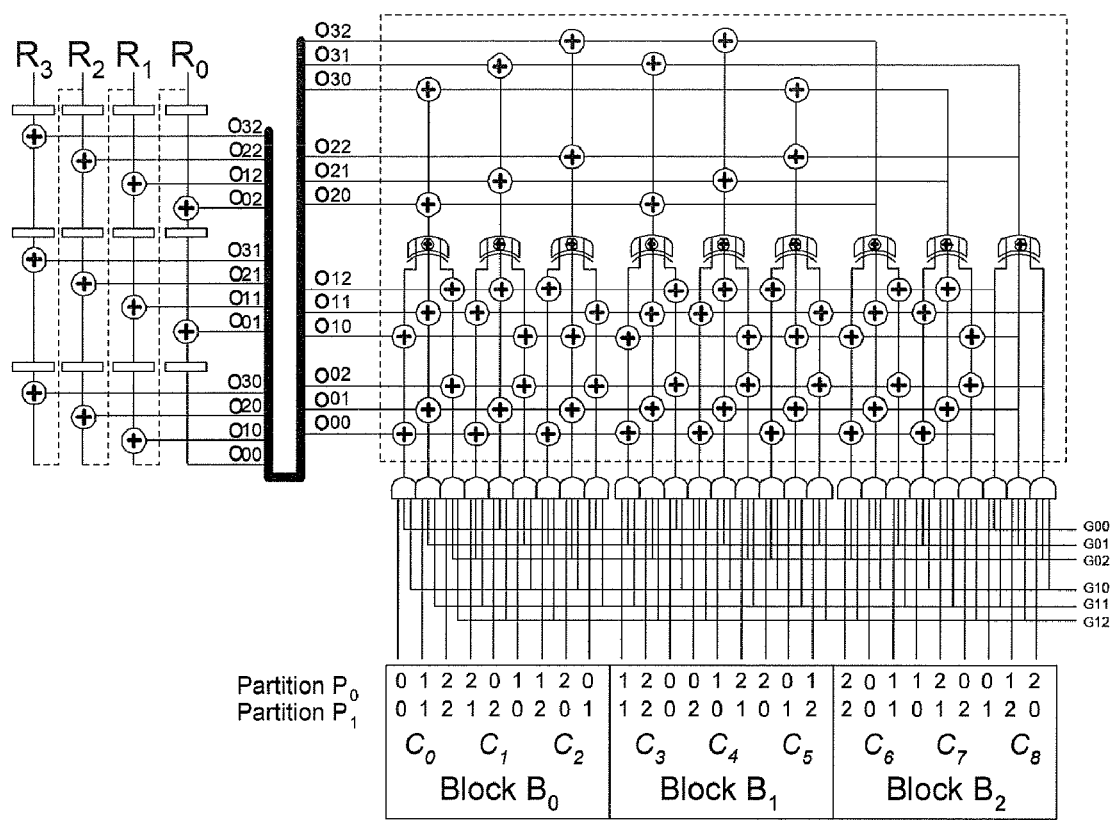
FIG. 8 is a block diagram of a finite AMC(3,4,2,2).

FIG. 8 illustrates a synthesis of a finite AMC(N,K,Q,T) when N=3, K=4, Q=2, and T=2. Accordingly, the finite AMC (N,K,Q,T) consists of three parts: a space compactor constructed based on output mapping H using 2 orthogonal partitions $O_0$ and $O_1$ from the first type and 2 orthogonal partitions $O_2$ and $O_3$ from the second type, an input selector constructed using 2 orthogonal partitions $P_0$ and $P_1$ from the third type, and 4 output registers $R_0$, $R_1$, $R_2$ and $R_3$ of length N which are coupled to 4 distinctive groups of outputs $O_0=\{o_{00},o_{01},o_{02}\}$, $O_1=\{o_{10},o_{11},o_{12}\}$, . . . , $O_3=\{o_{30},o_{31},o_{32}\}$ of the space compactor.

Space compactor is constructed based on equations x, (x+y)mod N, y and (y+z)mod N where each equation determines an output in the corresponding group of outputs which is assigned for observation of scan chain (x, y, z). As a result, any single error at the inputs of the finite AMC will produce a unique erroneous signature. Input selector is constructed using equations (x+y+z)mod N and (x+2y+z)mod N where each equation determines a group of scan chains in the corresponding partition for selection of scan chain (x, y, z). Partitions $P_0$ and $P_1$ for selection and $O_0$, $O_1$, . . . , $O_3$ for observation are mutually orthogonal. Similarly, in modes $M_0$, all scan chains are selected for compression and AMC(N,K,Q,T) can likely tolerate 2 unknown values in one shift cycle. In mode $M_1$, a group of N scan chains is selected for compression and AMC(N,K,Q,T) can tolerate 4 unknown values in one shift cycle. In mode $M_2$, N scan chains in the intersection of two groups of scan chains are selected for compression and AMC(N,K,Q,T) can tolerate any number of unknown values in one shift cycle.

Since the distinctive K groups of outputs of the finite AMC (N,K,Q,T) are coupled to K output registers $R_0$, $R_1$, . . . , $R_{K-1}$ of length N then the X-masking effect between the scan chains selected for compression in N consecutive shift cycles is possible. Since each error has a unique signature then any unknown value can be tolerated within N consecutive shift cycles. Next, the X-masking effect across multiple shift cycles can be reduced by masking all scan chains for selected shift cycles, or selecting scan chains for compression in a way that the number of unknown values passed into the output registers is minimized. As shown, the output registers can be serially connected in order to form a single output register of length KN. As not shown, the serially connected output registers may have one or more common feedback loops. In case of two or more common feedback loops, the X-masking effect needs to be completely avoided by constructing partitions in a way that each scan chain can be independently selected for compression.

Example 7

Figure 9:
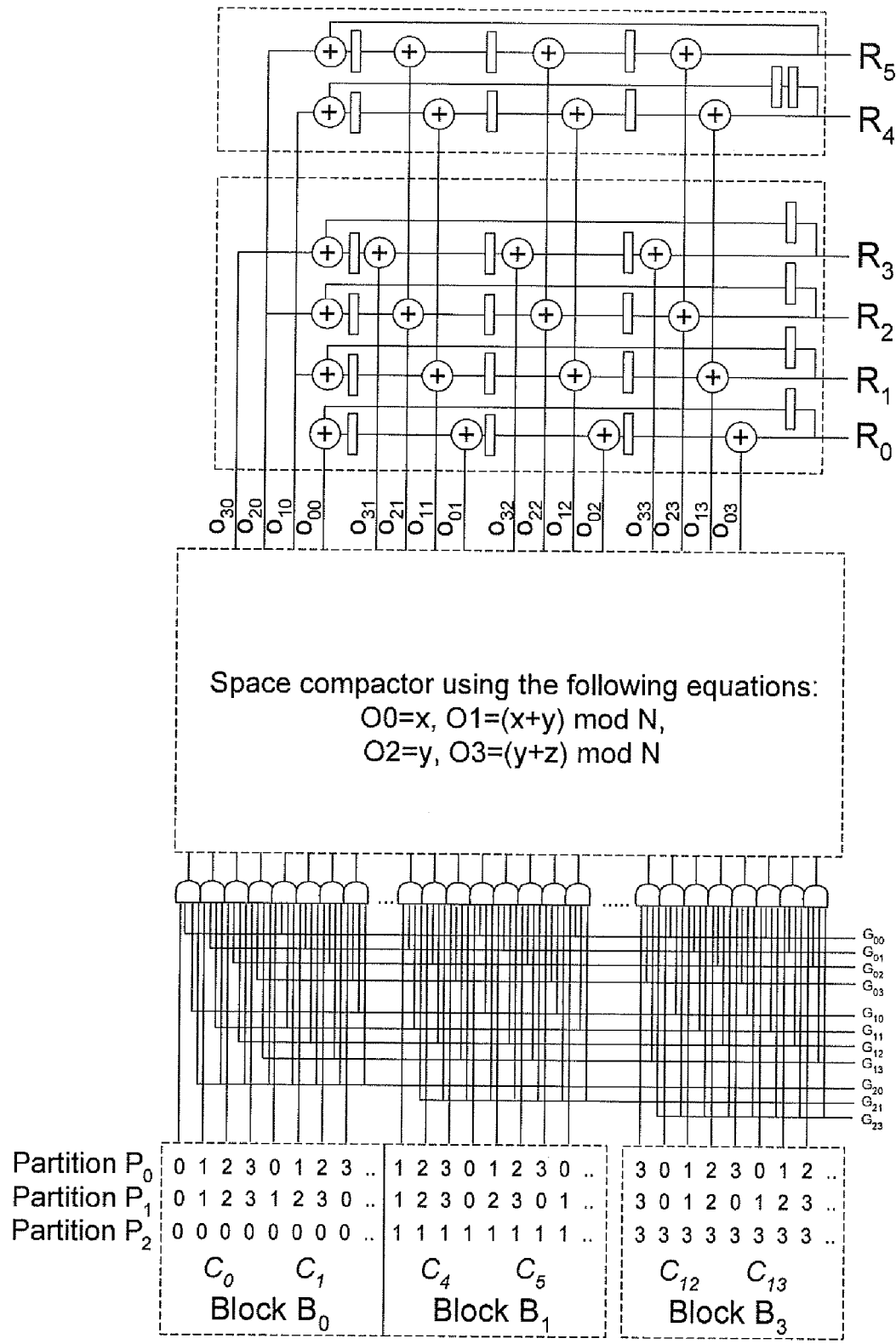
FIG. 9 is a block diagram of an infinite AMC(4,4,2,3).

FIG. 9 illustrates synthesis of an infinite AMC(N,K,Q,T) when N=4, K=4, Q=2 and T=3. Similarly, the infinite AMC (N,K,Q,T) includes: 1) a space compactor which is constructed using 2 orthogonal partitions $O_0$ and $O_1$ from the first type and 2 orthogonal partitions $O_2$ and $O_3$ from the second type defined by the following equations: x, (x+y)mod N, y and (y+z)mod N, respectively; 2) an input selector which is constructed using a set of three mutually exclusive partitions $P_0$, $P_1$ and $P_2$ defined by the following equations: z, (x+z)mod N and (x+y+z)mod N, respectively, and 3) K=4 output registers $R_0$, $R_1$, $R_2$ and $R_3$ of length N which are coupled to the distinctive groups of outputs $O_0=\{o_{00}, o_{01}, \ldots, o_{0,N-1}\}$, $O_1=\{o_{10}, o_{11}, \ldots, o_{1,N-1}\}, \ldots, O_3=\{o_{30}, o_{31}, \ldots, o_{3,N-1}\}$ of the space compactor. All partitions $O_0$, $O_1$, $O_2$ and $O_3$, for observation and $P_0$, $P_1$ and $P_2$ for selection are mutually orthogonal. Accordingly, partitions $P_0$, $P_1$ and $P_2$ are sufficient if each scan chain can be independently selected for compression. This condition guarantees an observation of each scan chain even when all other scan chains contain unknown values in the same shift cycle. To achieve this goal partitions $P_0$, $P_1$ and $P_2$ must be mutually exclusive. Output registers $R_0$, $R_1$, $R_2$ and $R_3$ are called here parallel registers and are defined by the following equations: $r_i^{t+1} = o_i \oplus r_{(L+i-1) \bmod L}^t$ for $i=\{0, 1, \ldots, L-1\}$ where $o_i$ is the i-th output in the corresponding group of outputs, $r_i^t$ is the i-th bit of the parallel output register in shift cycle t, L is the length of the parallel output register and $o_i=0$ for $i=\{N, N+1, \ldots, L-1\}$. Next, a second set of parallel output registers $R_4$ and $R_5$ of length $L_0$ and $L_1$, respectively, are coupled to the distinctive groups of outputs $O_1$ and $O_2$ such that N, $L_0$, $L_1$ are relatively prime, i.e., the greatest common divisor of each pair in the set of $\{N, L_0, L_1\}$ is equal to one.

In summary, the infinite AMC(N,K,Q,T) has three modes $M_0$, $M_1$ and $M_2$ for compression. In mode $M_0$, up to $N^3$ scan chains are selected for compression. In mode $M_1$, up to $N^2$ scan chains associated with a group of scan chains and a partition $P_0, P_1, \ldots, P_{T-1}$ are selected for compression. In mode $M_2$, up to $N^2$ scan chains defined by a sequence of intersection and union operations of two or more groups of scan chains are selected for compression. Next, a first set of K parallel output registers $R_0$, $R_1$, $R_2$ and $R_3$ of length N are coupled to the distinctive groups of outputs $O_0, O_1, \ldots O_{K-1}$ of the infinite AMC(N,K,Q,T). As a result, any single error at the inputs of the infinite AMC will produce a unique erroneous signature for N shift cycles. In addition, a second set of parallel output registers $R_4$ and $R_5$ of length $L_0$ and $L_1$, respectively, are coupled to the distinctive groups of outputs $O_0$, $O_1, \ldots, O_{K-1}$ of the infinite AMC(N,K,Q,T) such that N, $L_0$, $L_1$ are relatively prime. Accordingly, any single error at the inputs of the AMC will produce a unique erroneous signature for S=60 shift cycles where $S=N L_0 L_1$. As a result, double error masking effect in test responses from at most S consecutive shift cycles is not possible. Accordingly, a range of the infinite AMC(N,K,Q,T) is equal to $SN^3$. Also, since each error has a unique signature in the compactor range then each single error will produce an erroneous signature even when the error and one unknown value exist in test responses within the compactor range (at most S consecutive shift cycles).

Example 8

Figure 10:
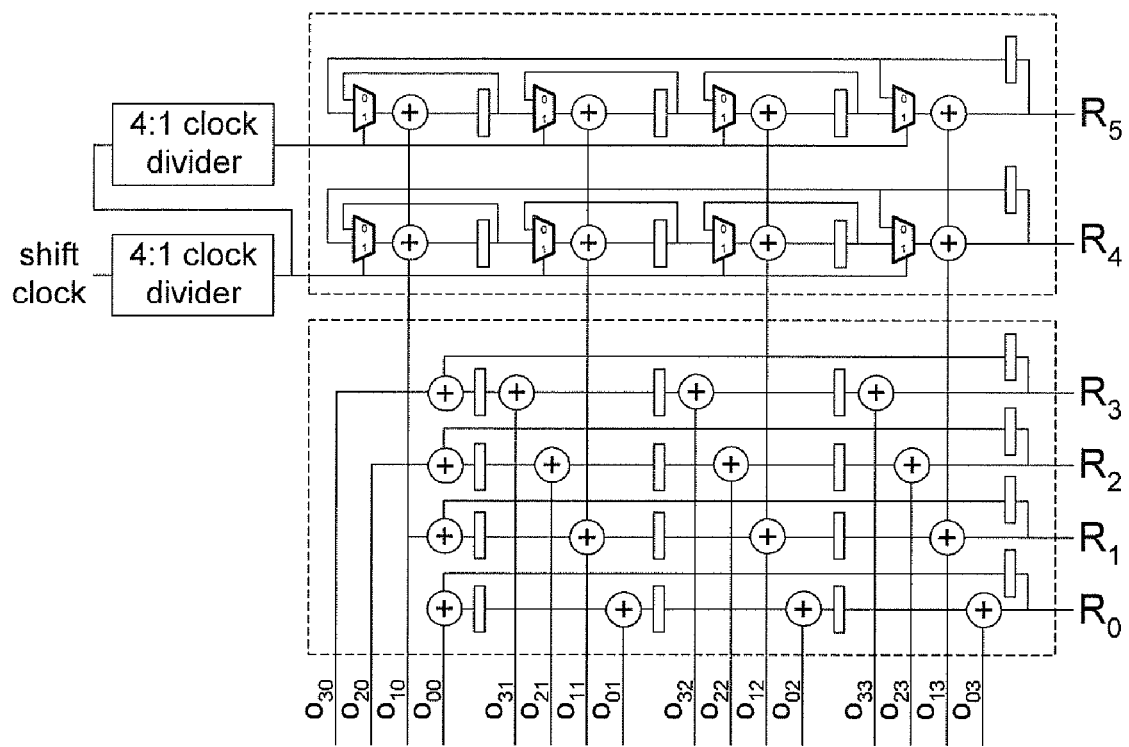
FIG. 10 is a block diagram of output registers of the infinite AMC(4,4,2,3) case 2.

FIG. 10 shows a second approach for synthesis of an infinite AMC(N,K,Q,T) when N=4, K=4 and Q=2. In this case, a second set of output registers $R_4$ and $R_5$ of length N, called here slow registers, which is shifting test data respectively N and $N^2$ times slower than output registers $R_0, R_1, R_2$ and $R_3$ in the first set. A slow output register is coupled to a group of outputs and is defined by the following equations: $r_i^{t+1} = o_i \oplus r_{(L+i-1) \bmod L}^t$ when (t mod N)=0 and $r_i^{t+1} = o_i \oplus r_i^t$ when (t mod N)≠0 for $i=\{0, 1, \ldots, L-1\}$ where $o_i$ is the i-th output in the corresponding group of outputs, $r_i^t$ is the i-th bit of the slow output register in shift cycle t, L is the length of the slow output register and $o_i=0$ for $i=\{N, N+1, \ldots, L-1\}$. For the presented infinite AMC(N,K,Q,T), any single error at the inputs will produce a unique erroneous signature for $S=N^3$ consecutive shift cycles. Accordingly, the range of the infinite AMC(N,K,Q,T) is equal to $N^6$ and it is calculated as a multiplication of the lengths of all output registers.

Example 9

Figure 11:
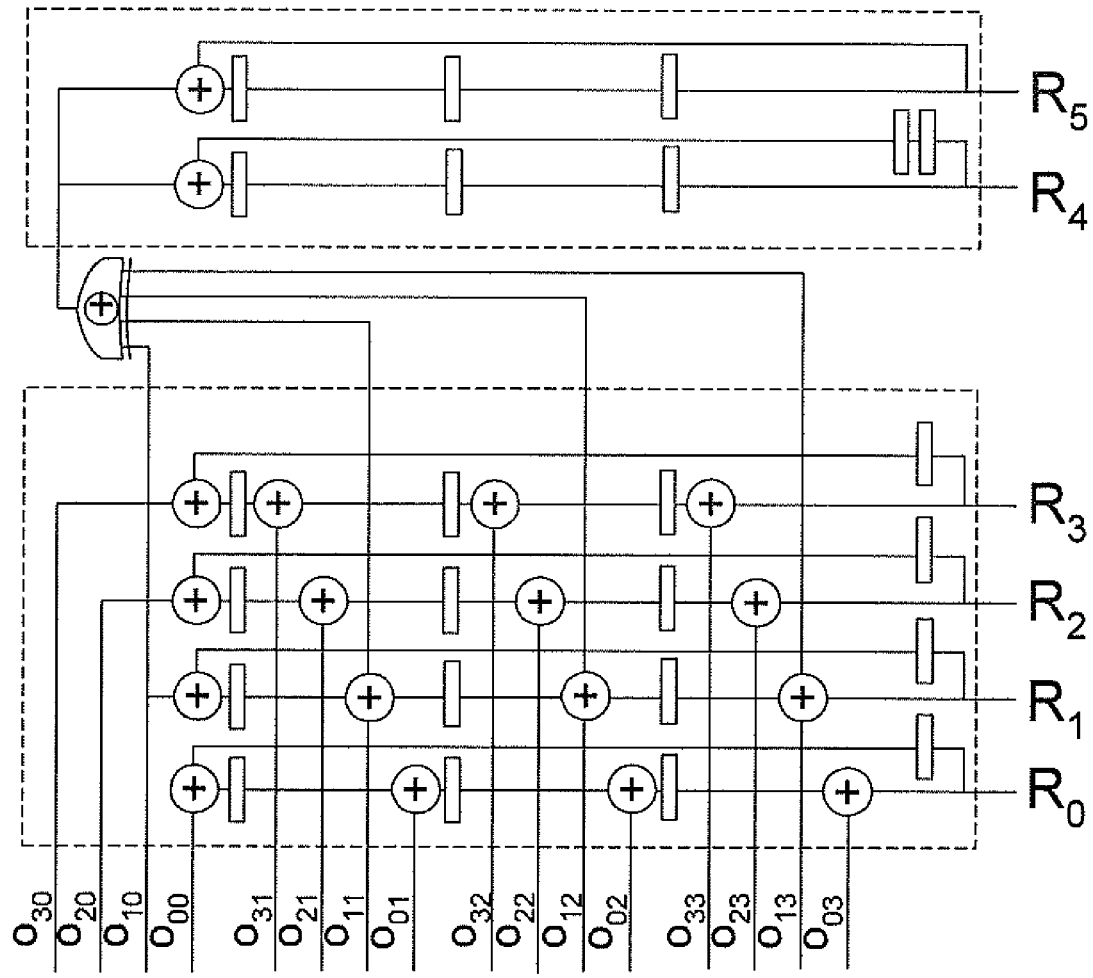
FIG. 11 is a block diagram of output registers of the infinite AMC(4,4,2,3) case 3.

FIG. 11 shows a third approach for synthesis of an infinite AMC(N,K,Q,T) when N=4, K=4 and Q=2. In this case, a second set includes output registers $R_4$ and $R_5$, called here parity output registers, of length $L_0$ and $L_1$, respectively, such that N, $L_0$, $L_1$ are relatively prime. Accordingly, each parity output register is coupled to a group of output and is defined by the following equations: $r_0^{t+1} = o_0 \oplus o_1 \oplus \ldots \oplus o_{N-1} \oplus r_{L-1}^t$ and $r_i^{t+1} = r_{i-1}^t$ for $i=\{1, 2, \ldots, L-1\}$ where $o_i$ is the i-th output in the corresponding group of outputs, $r_i^t$ is the i-th bit of the parity output register in shift cycle t, and L is the length of the parity output register. As a result, any single error at the inputs of the infinite AMC will produce a unique erroneous signature for S=60 consecutive shift cycles calculated as $N L_0 L_1$. Accordingly, the range of the infinite AMC(N,K,Q,T) is equal to $SN^3$.

Example 10

Figure 12:
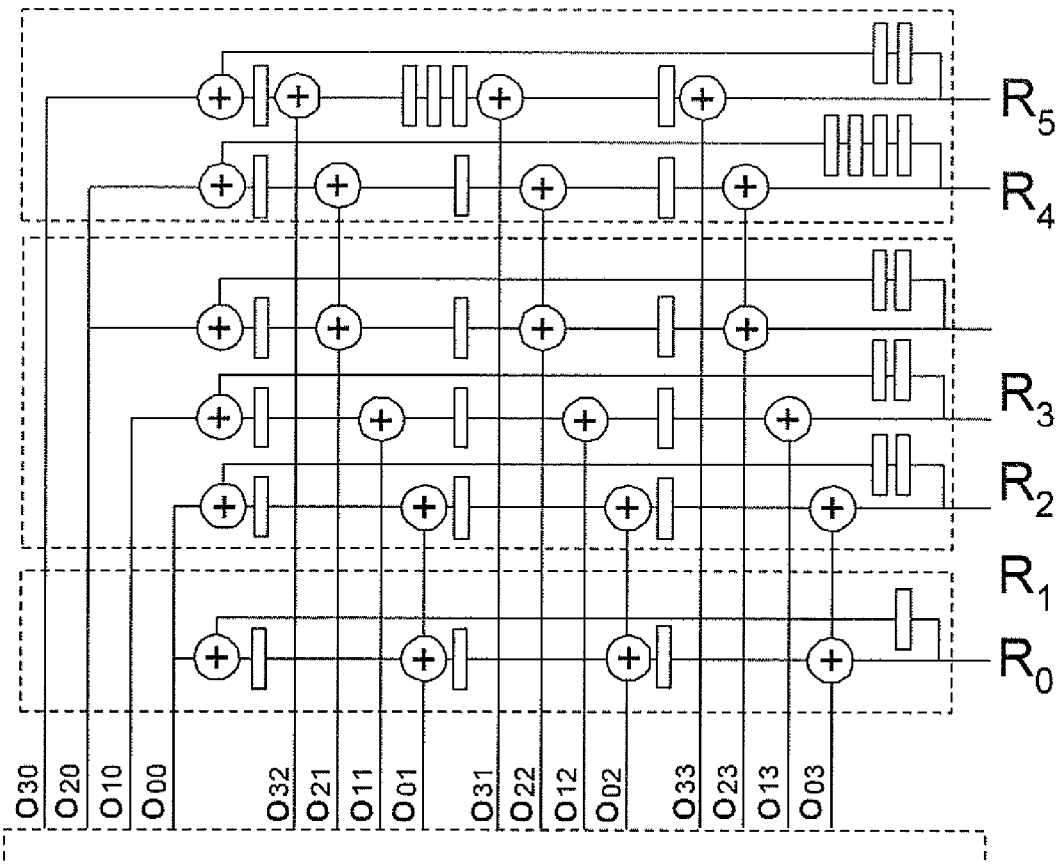
FIG. 12 is a block diagram of output registers of the infinite AMC(4,4,2,3) case 4.

FIG. 12 shows a fourth approach for synthesis of an infinite AMC(N,K,Q,T) when N=4, K=4 and Q=2 in a way that the error masking effect of quadruple errors is minimized within 10N consecutive shift cycles. Respectively, a first set of parallel output register $R_0$ of length N, a second set of parallel output registers $R_1$, $R_2$ and $R_3$ of length $L_1$ and a third set of output registers $R_4$ and $R_5$ of length $L_2$ are coupled to distinctive groups of N outputs. Output register $R_5$, called here a fast register, shifts test data by V=2 positions at a time is defined by the following equation: $r_i^{t+1} = o_{iV \bmod L} \oplus r_{(L+-1) \bmod L}^t$ for $i=\{0, 1, \ldots, L-1\}$ where $o_i$ is the i-th output in the corresponding group of outputs, $r_i^t$ is the i-th bit of the fast output register in shift cycle t, L is the length of the fast output register, $o_i=0$ for $i=\{N, N+1, \ldots, L-1\}$, $V=\{2,3\}$, V and L are relatively prime. As a result, the range of compactor is $N^4 L_1 L_2$ and the number of double errors producing a unique erroneous signature in 10N consecutive shift cycles is maximized.

In summary, the presented types of output registers (parallel, parity, slow and fast) of length $L \geq N$ can be coupled to the same group of outputs in order to increase the range of the compactor and reduce the error masking effect for even number of errors.

Example 11

FIG. 13 shows an extended set of modes of an AMC(N,K,Q,T) when N=3 and T=3. In mode $M_0$, all scan chains are selected for compression. In mode $M_1$, one or more groups of scan chain are selected for compression. In mode $M_2$, scan chains selected for compression are defined using a sequence of intersection and union operations over the groups of scan chains. Next, FIG. 14 illustrates a structure of commands for the control block that provides a flexible mode selection. Each command may have up to three fields: mode, indirect selection and direct selection. In the presented example, the field mode requires up to 3 bits and modes that are intended to be used more often, for example $M_0$, requires few bits than the other modes. The field indirect selection specifies a limited subset of choices which are defined by a sequence of intersection and union operations over the groups of scan chains. The number of bits required for the indirect selection depends on the number of valid choices. Mode $M_1$ provides an independent selection of each group of scan chains and restricted set of two groups of scan chains. Since 9 valid choices are possible, $G_{00}, G_{01}, \ldots, G_{22}$ then assuming a selection of up to 7 pairs of groups of scan chains the field indirect selection will require at least 4 bits. In addition, the direct selection may be applied with respect to a particular partition and mode, see for example mode $M_{22}$ shown in FIG. 13. Accordingly, the direct selection allows an arbitrary set of groups of scan chains within a particular partition to be selected for compression. The number of bits for the direct selection is equal to the number of groups of scan chains associated with this particular partition.

Next, each command can be valid for one or more consecutive shift cycles. In addition, each field may have a different scope. For example, the field mode may be valid for the whole pattern, the field indirect selection may be valid for a set of consecutive shift cycles, and the field direct selection may be valid for one shift cycle.

In summary, the goal of the presented mode selection scheme is to minimize the control data volume and maximize the observability in the presence of any number of unknown values in the test responses. The mode selection scheme may be optimized for a certain density and/or distribution of unknown values based on an analysis of the CUT. Alternatively, the mode selection scheme may provide a flexible mechanism to optimize the performance of the compactor circuitry when the density and/or distribution of the unknown values cannot be a priori determined.

The presented examples are based on the specific components like: a) constructing a space compactor using one or more specific output mappings optimized with respect to a specific mechanism for selecting scan chain for compression which are constructed based on mutually orthogonal partitions into groups of scan chains; b) connecting multiple output registers of different length and/or different types to distinctive groups of outputs of the space compactor. The above mentioned components of the presented method and apparatus for synthesis of space, finite and infinite AMC(N,K,Q,T) are advantageous to increasing the observability, and reducing the X-masking and error-masking effects, as well allows efficient diagnosis in compression mode.

Figure 15:
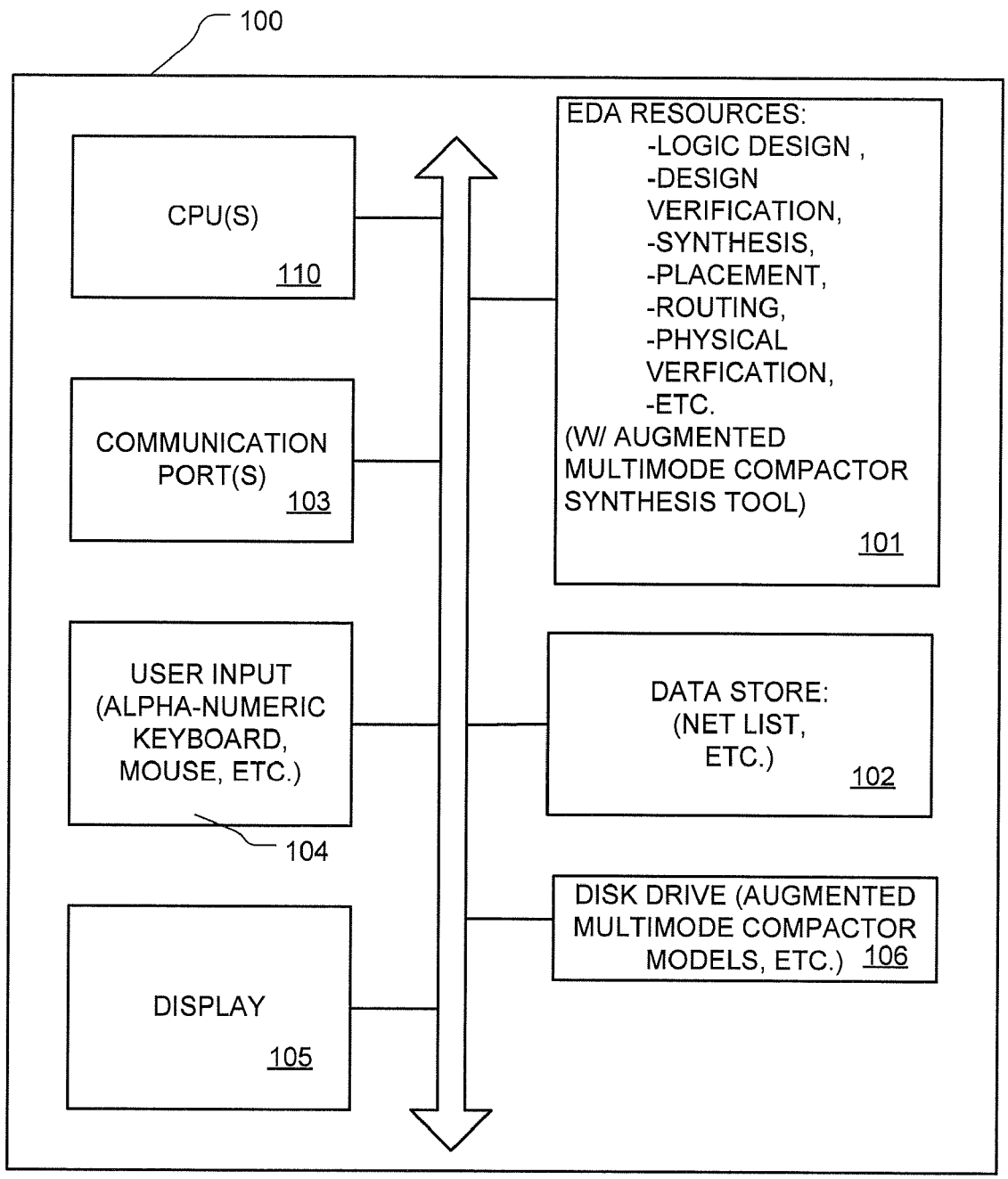
FIG. 15 is a simplified block diagram of a data processing system to perform electronic design automation.

FIG. 15 is a simplified block diagram of a data processing system 100 arranged as an electronic design automation system implementing the AMC described herein. The system 100 includes one or more central processing units 110, which are arranged to execute computer programs stored in program memory 101, access a data store 102, access large-scale memory such as a disk drive 106 or other long term storage based on electrical, magnetic, holographic, or other mass storage, and to control communication ports 103, user input devices 104, and a display 105. Electronic design automation systems include a single workstation, and networks of computers utilized by designers of integrated circuits.

The electronic design automation uses data processing resources including logic implemented as computer programs stored in memory 101 for an exemplary system. In alternatives, the logic can be implemented using computer programs in local or distributed machines, and can be implemented in part using dedicated hardware or other data processing resources. The logic in a representative electronic design automation system includes logic design tools, design verification tools, synthesis tools, placement tools, routing tools, physical verification tools and so on. The resources include an AMC synthesis tool as described herein.

The data store 102 is typically used for storing machine-readable definitions of circuits, such as high-level description language descriptions, netlists, mask definitions and so on. Different AMC designs with varying degrees of X-tolerance and aliasing are stored here.

Analysis of AMC(N,K,Q,T)

Figure 16:
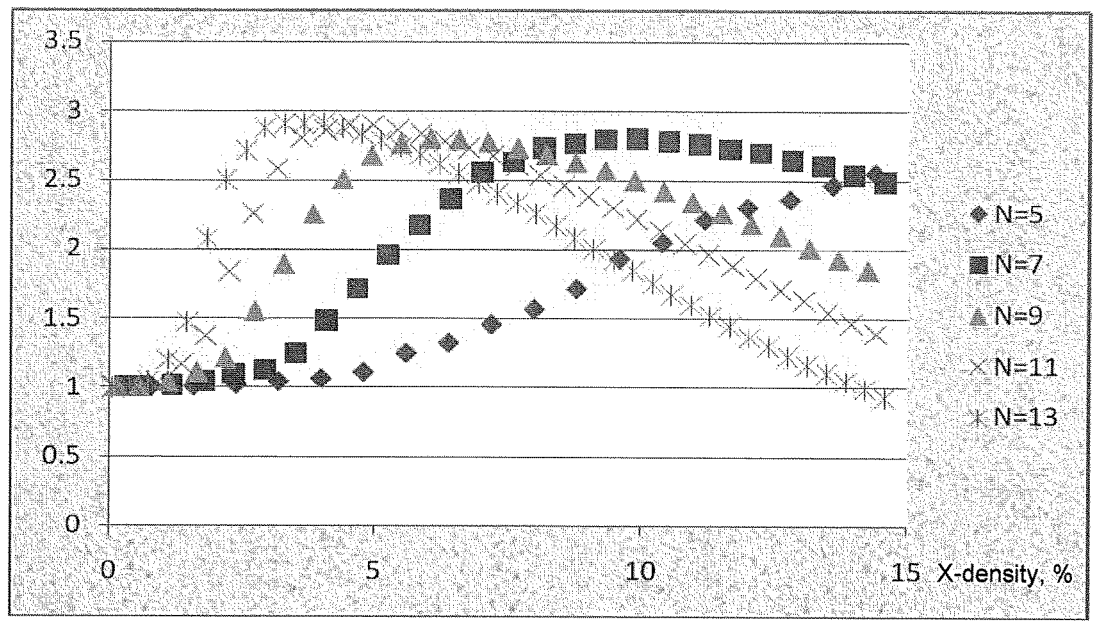
FIG. 16 is a graph showing improvement in the observability of AMC(N,3,1,2) in Example 2 with respect to the equivalent fully X-tolerant combinational compactor.

FIG. 16 shows an improvement of the observability of the combinational AMC(N,3,1,2) in Example 2 with respect to Peter Wohl, J. A. Waicukauski and S. Ramnath, "Fully X-tolerant combinational scan compression", in Proc. IEEE International Test Conference, 2007. Accordingly, both compactors use the same output mapping for mode $M_0$ (referred as a full-observability mode). The fully X-tolerant compactor had a second output mapping to support a direct-observability mode. The simulation results demonstrated that the AMC(N,3,1,2) achieved up to 3 times higher observability with similar hardware overhead and control data volume when the density of unknown values varies between 0 and 15 percent. As a result, a reduction in the number of test patterns as well as higher test coverage of the unmodeled defects is expected. In addition, using a single output mapping in Example 2 simplifies the compactor architecture.

Figure 17:
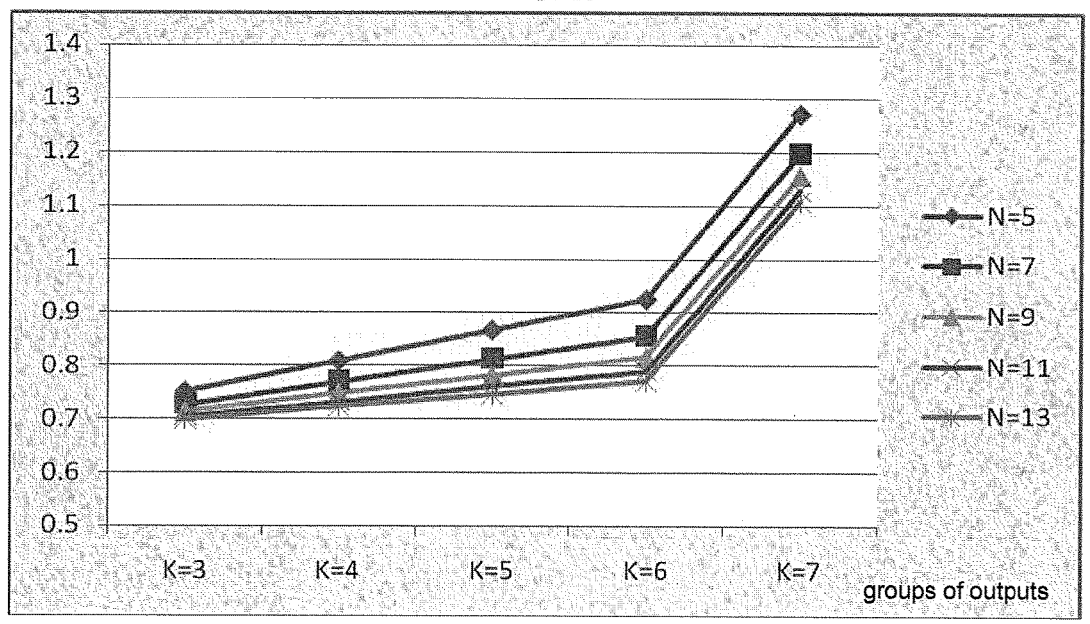
FIG. 17 is a graph showing relative hardware overhead of the space compactors constructed using up to 7 mutually orthogonal partitions in Example 5 with respect to the space compactors constructed based on the Steiner triple system S(2,3,M).

FIG. 17 shows a relative hardware overhead of the space compactors constructed based on up to 7 mutually orthogonal partitions in Example 5 with respect to a space compactor constructed based on Steiner triple system S(2,3,M). In FIG. 17, the five graph points at each x coordinate, going from top to bottom, correspond to the right legend, also going from top to bottom. Accordingly, at each x coordinate, the topmost graph point corresponds to N=5, the bottommost graph point corresponds to N=13, etc. For example, a value of 0.5 means the space compactor of AMC requires 2 times less 2-input XOR gates than the alternative space compactor. The hardware overhead of the space compactors of AMC was calculated by the equation $V N^2(N-1)+KN(N-1)$ where V=2 for $N \leq 6$ and V=3 for N=7. Accordingly, the hardware overhead of the alternative space compactor was calculated by the following equation $3N^3-O$ where O is the number of the space compactor outputs. As a result, when $K \leq 6$, the hardware overhead of the space compactor of AMC was between 10 and 30 percent smaller than the hardware overhead of the alternative space compactors.

Figure 18:
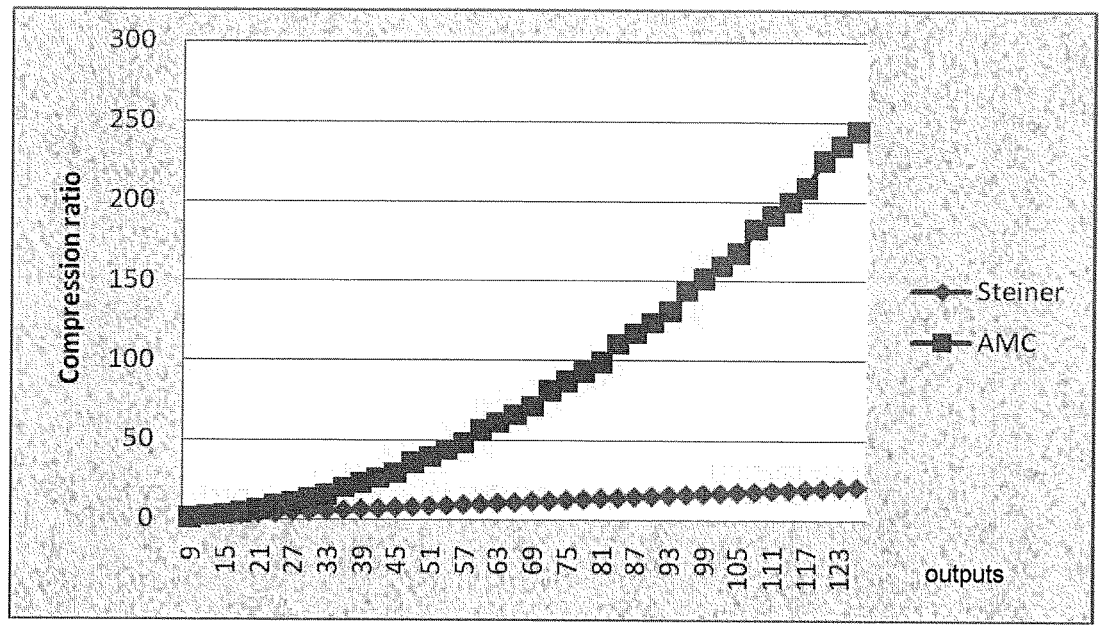
FIG. 18 is a graph of compression ratio (number of inputs divided by the number of outputs of the space compactor) of the space compactor of AMC(N,4,2,T) in Example 6 and the space compactor constructed based on Steiner triple system S(2,3,M) where O is the number of AMC outputs, $N_0 N_1 N_2$ and M are the number of inputs of AMC and alternative space compactor, and $N_0=O/4$, $N_1=(O+1)/4$, $N_2=(O+2)/4$.

FIG. 18 shows an improvement in a compression ratio (number of inputs divided by the number of outputs of the compactor) of the space compactor of the finite AMC(N,4,2,2) in Example 6 with respect to Janusz Rajski and Jerzy Tyszer, "Synthesis of X-tolerant convolutional compactors", in Proc. IEEE VLSI Test Symposium, 2005. Accordingly, for 1000 and 2000 scan chains, the finite AMC(N,4,2,2) required between 40 and 51 outputs while a convolutional compactor constructed based on Steiner triple system S(2,3,M) required between 78 and 111 outputs, respectively.

Figure 19:
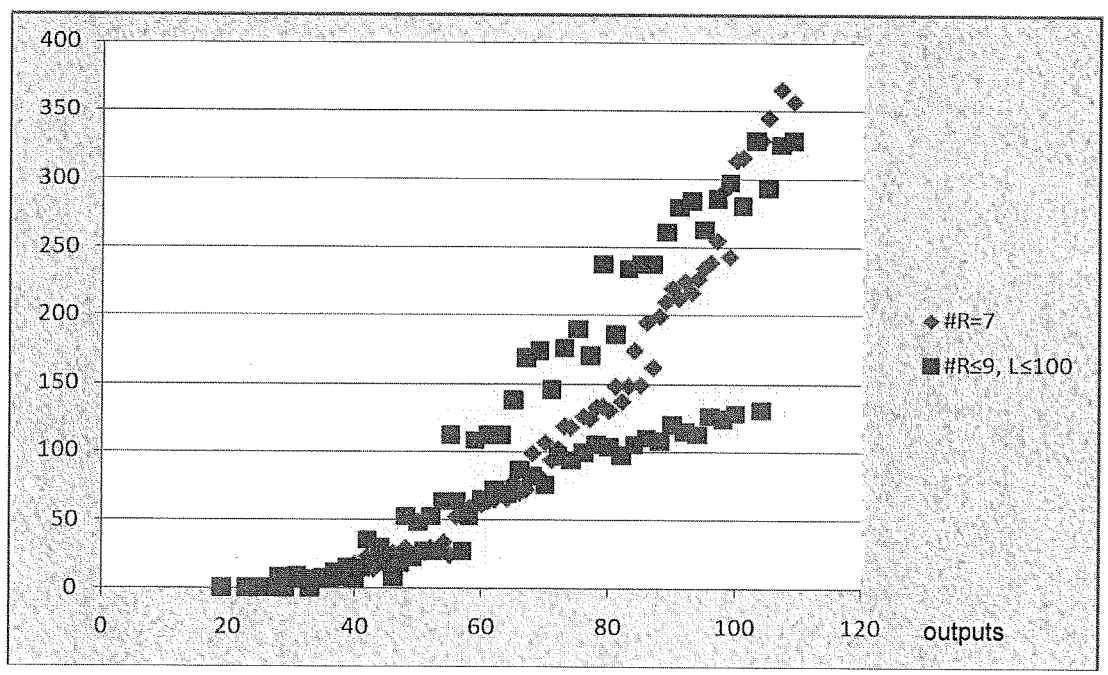
FIG. 19 is a graph showing improvement in the range of the finite AMC(N,4,2,3) in Example 7 with respect to the Modular compactor when K=4.

FIG. 19 shows an improvement in the range of the infinite AMC(N,4,2,3) in Example 7 with respect to Wojciech Rajski and Janusz Rajski, "Modular compactor of test responses", IEEE VLSI Test Symposium, 2006. More precisely, the ratio between the ranges of both compactors was calculated when K=4 and the total length (number of flip-flops) changed from 20 to 110 in two cases: case 1) the number of output registers of the infinite AMC was restricted to 7, and case 2) the number of output registers was restricted to 9 and parameter S (a maximum length of the scan chains) was restricted to 100. Accordingly, for the range between 100 K and 10 M (scan cells), the infinite AMC required between 40 and 72 flip-flops in the output registers while the Modular compactor required between 73 and 227 flip-flops in the output registers.

According to Wojciech Rajski and Janusz Rajski, "Modular compactor of test responses", IEEE VLSI Test Symposium, 2006, a single error occurred in 77% of the failing patterns, double error in 12%, triple error in 4%, and quadruple error in 2%. Ten or less errors explained more than 98% of all failing patterns. Let a dictionary based approach be used for deriving an initial list of fault candidates for an effect-cause diagnosis in compression mode. In general, the fault candidates producing more than one error in the test responses need to be included in a dictionary. Accordingly, for single error, the initial list of fault candidates can be derived by backtracing the CUT starting from the corresponding failing scan cell that can be uniquely identified within the compactor range. The proposed compactor scheme allows the double errors to be excluded from the dictionary since a complete list of all potential pairs of failing scan cells can be easily calculated based on the erroneous signature. Based on the above assumption, the size of the dictionary will be reduced by 50%.

FIG. 20 shows experimental data of the infinite AMC(N, 4,2,3) in Example 7 for N={3, 4, . . . , 13}. This includes the values of parameters N, $L_1$, $L_2$ and S (the compactor range in shift cycles), the number of the scan chains, the total length of the output registers $R_0$, $R_1$, . . . , $R_5$, combinational compression ratio and the probability for quadruple error masking within 10N shift cycles for modes $M_0$, $M_1$ and $M_2$ (assuming that all scan chains, a group of scan chains and an intersection of two groups of scan chains are selected for compression). FIG. 21 shows the same experimental data for the infinite AMC(N,4,2,3) in Example 10. An improvement in the probability for the quadruple error masking for Example 10 with respect to Example 7 was between 2.2 and 4.7 times.

Figure 22:
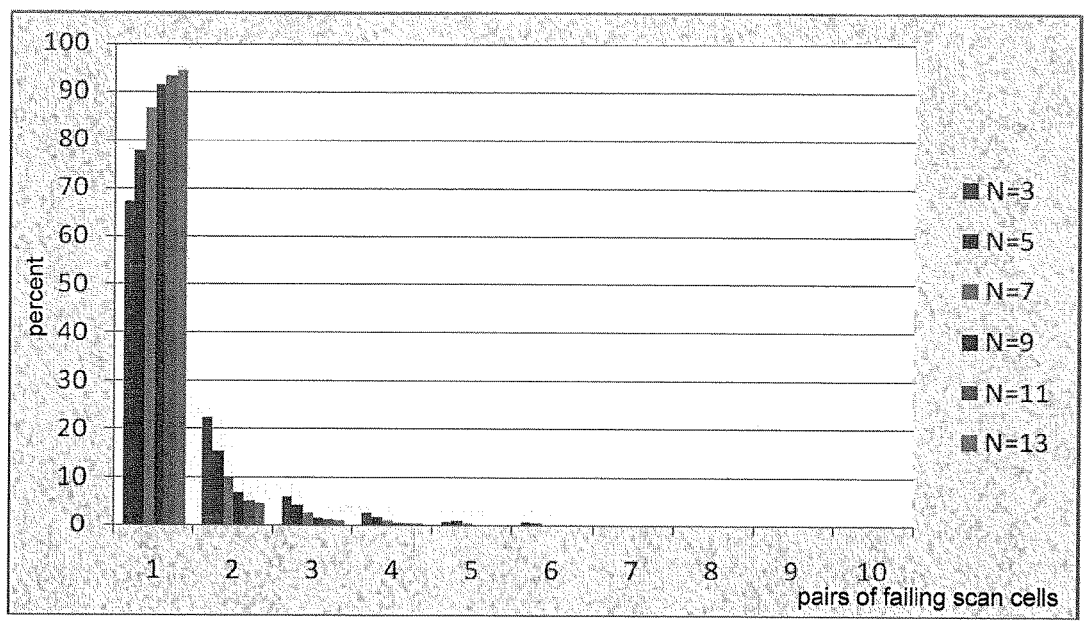
FIG. 22 is a graph showing distribution of pairs of failing scan cells explaining double errors for the infinite AMC(N, 4,2,3) in Example 10 when N={3, 4, . . . , 13}.

Next, the number of potential pairs of failing scan cells that could explain a double error in test response within 10N shift cycles was estimated. FIG. 22 shows the experimental data for the infinite AMC(N,4,2,3) in Example 10. In FIG. 22, the six bars at each x coordinate, going from left to right, correspond to the right legend, going from top to bottom. Accordingly, at each x coordinate, the leftmost bar corresponds to N=3, the rightmost bar corresponds to N=13, etc.

Accordingly, the maximum number of potential pairs that could explain a particular double error within 10N shift cycles was 10. When N≧9, the probability for unique failure mapping was higher than 90 percent. The corresponding data for Example 7 were 19 potential pairs and 75 percent. This experiment demonstrates the efficiency of the proposed approach for reduction of the number of potential pairs of failing scan cells in order to allow efficient diagnosis in compression mode. This is the first time that such properties were demonstrated for the infinite time compactors.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
an integrated circuit including circuitry compacting test response data from scan chains in the integrated circuit under test, the circuitry comprising:
a first set of logic gates coupled to the scan chains;
a plurality of output registers receiving the test response data from the scan chains via the first set of logic gates, said plurality of output registers including sequential elements and a second set of logic gates that process the test response data with stored data in said output registers,
wherein groups of the scan chains are coupled to output registers of said plurality of output registers, such that a same group of the groups of the scan chains is coupled to sequential elements of different output registers of said plurality of output registers; and
wherein the same group is a subset of the scan chains including two or more scan chains.

2. The apparatus of claim 1, wherein at least two output registers of the plurality of output registers have lengths of sequential elements, and wherein the lengths have a greatest common divisor of 1.

3. The apparatus of claim 1, wherein at most one scan chain is shared between the groups of the scan chains coupled to the sequential elements of the different output registers of said plurality of output registers.

4. The apparatus of claim 1, wherein at least one output register of the plurality of output registers has at most one feedback loop.

5. The apparatus of claim 1, wherein at least two registers of the plurality of output registers are coupled to each other sequentially.

6. The apparatus of claim 1, wherein at least two registers of the plurality of output registers are coupled to each other sequentially and said at least two registers of the plurality of output registers have at least one common feedback loop.

7. A computer-implemented method, comprising:
dividing a plurality of scan chains among at least groups and a plurality of partitions, the plurality of scan chains in an integrated circuit under test, the plurality of scan chains processing test response data, such that:
(i) the groups disallow sharing a common scan chain from the plurality of scan chains, within a particular partition of the plurality of partitions, and
(ii) at least one common scan chain is shared between the groups of different partitions of the plurality of partitions, such that the groups of a first partition of the plurality of partitions share at least one common scan chain with at least one group of a second partition of the plurality of partitions; and
based on at least said dividing, selectively compressing test response data from the plurality of scan chains over a plurality of shift cycles.

8. The method of claim 7, wherein at least one common scan chain is shared between all the groups of different partitions of the plurality of partitions, such that each group of the first partition of the plurality of partitions shares at least one common scan chain with each group of the second partition of the plurality of partitions.

9. The method of claim 7, wherein at most one common scan chain is shared between the groups of different partitions of the plurality of partitions.

10. The method of claim 7, further comprising:
defining a set of instructions including at least a mode field, a direct selection field, and an indirect selection field,
wherein the mode field in an instruction of the set of instructions has a mode valid for one or more shift cycles specifying at least one of: (i) the plurality of scan chains is selected for compression, (ii) no scan chains of the plurality of scan chains is selected for compression, (iii) scan chains selected for compression are defined by the indirect selection and (iv) scan chains selected for compression by the instruction are defined for a particular shift cycle as an intersection of scan chains specified by the indirect selection field and the direct selection field for the particular shift cycle.

11. The method of claim 10, comprising:
wherein the indirect selection field is valid for one or more shift cycles and,
wherein the indirect selection field is applied to the plurality of partitions, and the indirect selection field specifies at least one of: (i) at least one group of the groups of scan chains associated with a particular partition of the plurality of partitions, (ii) an intersection of at least two groups of the groups of scan chains each associated with at least two partitions of the plurality of partitions, and (iii) a sequence of intersection and union operations of at least two groups of the groups of scan chains associated with the plurality of partitions.

12. The method of claim 10, wherein the direct selection field is applied to at most one partition of the plurality of partitions, and specifies a combination of the groups of scan chains associated with said at most one partition for a shift cycle.

13. A computer-implemented method, comprising:
synthesizing a compactor circuit in the integrated circuit including an input sector, and space compactor, including:
  dividing a plurality of scan chains among at least groups and partitions, the plurality of scan chains in an integrated circuit under test, the plurality of scan chains processing test response data, the partitions include a first plurality of partitions and a second plurality of partitions such that:
  (i) within partitions of the first plurality of partitions, the groups disallow sharing a common scan chain from the plurality of scan chains,
  (ii) within partitions of the second plurality of partitions, the groups disallow sharing a common scan chain from the plurality of scan chains,
  (iii) at least one common scan chain from the plurality of scan chains is shared between: the groups of different partitions of the first plurality of partitions, such that the groups of a first partition of the first plurality of partitions share at least one common scan chain with at least one group of a second partition of the first plurality of partitions and
  (iv) at least one common scan chain from the plurality of scan chains is shared between: the groups of different partitions of the second plurality of partitions, such that the groups of a first partition of the second plurality of partitions share at least one common scan chain with at least one group of a second partition of the second plurality of partitions; and
  based on the first plurality of partitions, synthesizing an input selector;
  based on the second plurality of partitions, synthesizing a space compactor,
  wherein (i) partitions of said second plurality of partitions correspond to groups of outputs of the space compactor, such that some partition of said second plurality of partitions corresponds to some group of outputs of the space compactor, and
  wherein (ii) partitions of said second plurality of partitions specify particular groups of the groups of the plurality of scan chains, and (iii) said specified particular groups are observable at same outputs within the corresponding groups of outputs, such that a first specified particular group of scan chains is observable at a same output within the corresponding group of outputs.

14. The method of claim 13, wherein at least one common scan chain of the plurality of scan chains is shared between the groups of a set of partitions, the set of partitions including the first plurality of partitions and the second plurality of partitions, such that each group of a first partition of the set of partitions shares at least one common scan chain with each group of a second partition of the set of partitions.

15. The method of claim 13, wherein at most one scan chain of the plurality of scan chains is shared between the groups of a set of partitions, the set of partitions including a subset of the second plurality of partitions excluding at most one partition from the second plurality of partitions.

16. The method of claim 13, wherein at most one scan chain of the plurality of scan chains is shared between the groups of a set of partitions, the set of partitions including the first plurality of partitions and at most one partition of a subset of the second plurality of partitions, the subset of the second plurality of partitions excluding at most one partition from the second of plurality of partitions.

17. The method of claim 13, further comprising:
synthesizing a plurality of output registers coupled to the groups of outputs of the space compactor, wherein at least two output registers of the plurality of output registers are coupled to a same group of the groups of outputs of the space compactor.

18. The method of claim 13, further comprising:
synthesizing a plurality of output registers coupled to the groups of outputs of the space compactor, wherein at least two output registers of the plurality of output registers are coupled to different groups of the groups of outputs of the space compactor.

19. The method of claim 13, further comprising:
synthesizing a plurality of output registers coupled to the groups of outputs of the space compactor, wherein the plurality of output registers have length of sequential elements and wherein the length of at least two output registers of the plurality of output registers have a greatest common divisor different than 1.

\* \* \* \* \*